(12) United States Patent
Chen et al.

(10) Patent No.: US 10,950,685 B2
(45) Date of Patent: Mar. 16, 2021

(54) TILED ELECTRONIC DEVICE

(71) Applicant: InnoLux Corporation, Miao-Li County (TW)

(72) Inventors: Chien-Chih Chen, Miao-Li County (TW); Shan-Hung Tsai, Miao-Li County (TW); Chin-Der Chen, Miao-Li County (TW); Cheng-Fu Wen, Miao-Li County (TW); Chin-Lung Ting, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 101 days.

(21) Appl. No.: 16/288,547

(22) Filed: Feb. 28, 2019

(65) Prior Publication Data

US 2019/0305073 A1    Oct. 3, 2019

Related U.S. Application Data

(60) Provisional application No. 62/649,986, filed on Mar. 29, 2018.

(30) Foreign Application Priority Data

Jun. 22, 2018   (CN) .......................... 201810651654.9

(51) Int. Cl.
*H01L 27/32*       (2006.01)
*G02F 1/1333*     (2006.01)
(Continued)

(52) U.S. Cl.
CPC .... *H01L 27/3293* (2013.01); *G02F 1/133305* (2013.01); *H01L 25/0753* (2013.01);
(Continued)

(58) Field of Classification Search
CPC ............ G06F 3/1446; G09G 2300/026; H01L 27/3293; H01L 27/326; H01L 27/3297;
(Continued)

(56) References Cited

U.S. PATENT DOCUMENTS 8,922,511 B1 * 12/2014 Salmon ................. G06F 1/1643
345/173
9,825,674 B1 * 11/2017 Leabman ................ H02J 50/20
(Continued)

FOREIGN PATENT DOCUMENTS

CN         102982744 A      3/2013
JP         2004178854 A     6/2004
(Continued)

OTHER PUBLICATIONS

WO2014094562—Light-Emitting Diode (LED) Display Module (Peng, Xiaolin) 2014 Electronic English Translation by Wipo Patents https://patentscope.wipo.int/search/en/detail.jsf?docId=WO2014094562&tab=PCTDESCRIPTION[Aug. 3, 2020 (Year: 2020).*

*Primary Examiner* — Ricardo Osorio
(74) *Attorney, Agent, or Firm* — Muncy, Geissler, Olds and Lowe, P.C.

(57) ABSTRACT

A tiled electronic device includes a first electronic device and a second electronic device adjacent to each other. The first electronic device includes a first substrate having a first upper surface, a first lower surface, and a first side surface; and a first flexible substrate including a first upper portion, a first lower portion, and a first connection portion. The first upper portion is disposed corresponding to the first upper surface. The first lower portion is disposed corresponding to the first lower surface. The first connection portion is disposed corresponding to the first side surface. The second electronic device includes a second substrate having a second upper surface, a second lower surface, and a second
(Continued)

side surface. The second side surface is opposite and adjacent to the first side surface. The first connection portion is located between the first side surface and the second side surface.

19 Claims, 15 Drawing Sheets

(51) Int. Cl.
  *H01L 51/00* (2006.01)
  *H05K 1/02* (2006.01)
  *H01L 25/075* (2006.01)

(52) U.S. Cl.
  CPC ........ *H01L 27/326* (2013.01); *H01L 27/3297* (2013.01); *H01L 51/0097* (2013.01); *H05K 1/028* (2013.01); *G02F 2001/133388* (2013.01); *H01L 2251/5338* (2013.01); *H05K 2201/10128* (2013.01)

(58) Field of Classification Search
  CPC ............. H01L 25/0753; H01L 51/0097; H01L 2251/5338; G02F 1/133305; G02F 2001/133388; H05K 2201/10128
  See application file for complete search history.

(56) References Cited

U.S. PATENT DOCUMENTS

| | | | |
|---|---|---|---|
| 10,424,632 B2* | 9/2019 | Nakamura | H01L 51/0097 |
| 2007/0284994 A1* | 12/2007 | Morimoto | H05B 33/14 |
| | | | 313/483 |
| 2008/0106874 A1* | 5/2008 | Okuda | H05K 1/0281 |
| | | | 361/749 |
| 2009/0241388 A1* | 10/2009 | Dunn | G09F 9/33 |
| | | | 40/463 |
| 2011/0050657 A1* | 3/2011 | Yamada | H01L 51/5237 |
| | | | 345/204 |
| 2013/0127667 A1* | 5/2013 | Schneider | G01S 13/89 |
| | | | 342/374 |
| 2014/0042406 A1 | 2/2014 | Degner et al. | |
| 2014/0049449 A1* | 2/2014 | Park | G09G 5/00 |
| | | | 345/1.3 |
| 2015/0041766 A1* | 2/2015 | Naijo | H01L 27/3244 |
| | | | 257/40 |
| 2015/0382446 A1 | 12/2015 | Kwon et al. | |
| 2016/0014882 A1* | 1/2016 | Jongman | G02F 1/13338 |
| | | | 361/749 |
| 2016/0170443 A1* | 6/2016 | Namkung | G06F 1/1643 |
| | | | 359/483.01 |
| 2016/0253935 A1* | 9/2016 | Gerets | G02F 1/13318 |
| | | | 345/1.3 |
| 2016/0343781 A1* | 11/2016 | Kawata | H01L 27/323 |
| 2017/0023979 A1* | 1/2017 | Yamazaki | G06F 1/1652 |
| 2017/0127539 A1* | 5/2017 | Drabant | G09F 9/3026 |
| 2017/0148374 A1* | 5/2017 | Lee | G09G 5/14 |
| 2017/0227636 A1* | 8/2017 | Moulder | G01S 13/003 |
| 2017/0343868 A1 | 11/2017 | Kim et al. | |
| 2018/0027673 A1 | 1/2018 | Andou | |
| 2018/0113564 A1* | 4/2018 | Takahashi | G06F 3/044 |
| 2018/0151539 A1* | 5/2018 | Nakamura | H01L 27/3293 |
| 2019/0035765 A1* | 1/2019 | Kim | B32B 7/12 |
| 2019/0198575 A1* | 6/2019 | Liu | G09G 3/22 |
| 2019/0385732 A1* | 12/2019 | Schoville | G16H 40/20 |
| 2020/0163233 A1* | 5/2020 | Brackley | H01L 25/0753 |

FOREIGN PATENT DOCUMENTS

| | | | | |
|---|---|---|---|---|
| JP | 2009205897 A | | 9/2009 | |
| WO | 2007054947 A | | 5/2007 | |
| WO | 2014094562 A | | 6/2014 | |
| WO | WO-2014094562 A1 * | | 6/2014 | ......... H01L 25/0753 |

* cited by examiner

TILED ELECTRONIC DEVICE

CROSS REFERENCE TO RELATED APPLICATION

This application claims the benefit of filing date of U.S. Provisional Application Ser. No. 62/649,986, filed Mar. 29, 2018, the subject matter of which is incorporated herein by reference.

This application also claims the benefits of the Chinese Patent Application Serial Number 201810651654.9, filed on Jun. 22, 2018, the subject matter of which is incorporated herein by reference.

BACKGROUND

1. Field of the Disclosure

The present disclosure relates to a tiled electronic device and, or a tiled electronic device for reducing border.

2. Description of Related Art

In the current information age, how to obtain or deliver information faster or more efficiently has been regarded as one of the indicators of competitiveness. For example, the public information display (PID) can provide information, or it has gradually replaced the conventional bulletin board. The public information display has been developed to be large size or high resolutions, various display panel manufacturers are developed to be a large-size electronic device or the tiled electronic devices.

However, the conventional tiled electronic devices usually use the passive electronic device, the passive electronic device typically require the use of a large number of integrated circuit (IC), resulting in the disadvantage of high cost or high power consumption. Therefore, it is highly desirable to develop an active tiled electronic device with high resolution, reduced borders, or increase visual quality.

SUMMARY

The present disclosure provides a tiled electronic device, which is characterized in the tiled electronic device includes: a first electronic device including: a first substrate having a first upper surface, a first lower surface opposite to the first upper surface, and a first side surface connected between the first upper surface and the first lower surface; a first flexible substrate including a first upper portion, a first lower portion, and a first connection portion connected between the first upper portion and the first lower portion, wherein the first upper portion is disposed corresponding to the first upper surface, the first lower portion is disposed corresponding to the first lower surface, and the first connection portion is disposed corresponding to the first side surface; and a second electronic device disposed adjacent to the first electronic device and including: a second substrate having a second upper surface, a second lower surface opposite to the second upper surface, and a second side surface connected between the second upper surface and the second lower surface, wherein the second side surface is opposite and adjacent to the first side surface, and the first connection portion is located between the first side surface and the second side surface.

Other objects, advantages, or novel features of the disclosure will become more apparent from the following detailed description when taken in conjunction with the accompanying drawings.

DETAILED DESCRIPTION OF THE EMBODIMENTS

In the following description, various embodiments will be provided to explain the implementation and operation of the present disclosure. The person skilled in the art of the present disclosure will understand the features and advantages of the present disclosure through these embodiments. Various combinations, modifications, substitutions or adaptations may be realized based on the present disclosure.

Furthermore, the use of the ordinal numbers such as "first", "second", "third", etc. in the specification and claims to modify the elements of the claims do not imply that a claimed element is physically provided with an ordinal number. The ordinal numbers do not represent the order between a claimed element and another claimed element, or the order of a manufacturing method. The use of these ordinal numbers is only for clearly distinguishing a claimed element having a certain name from another claimed element having the same name.

In addition, the prepositions mentioned in the present specification and claims, such as "above", "on", "disposed on" or "upon", may refer to direct contact of two elements, or may refer to indirect contact of two elements.

The following gives exemplary embodiments of the disclosure, but it is not limited thereto. The present disclosure can be combined with other known structures to form another embodiment.

Figure 1:
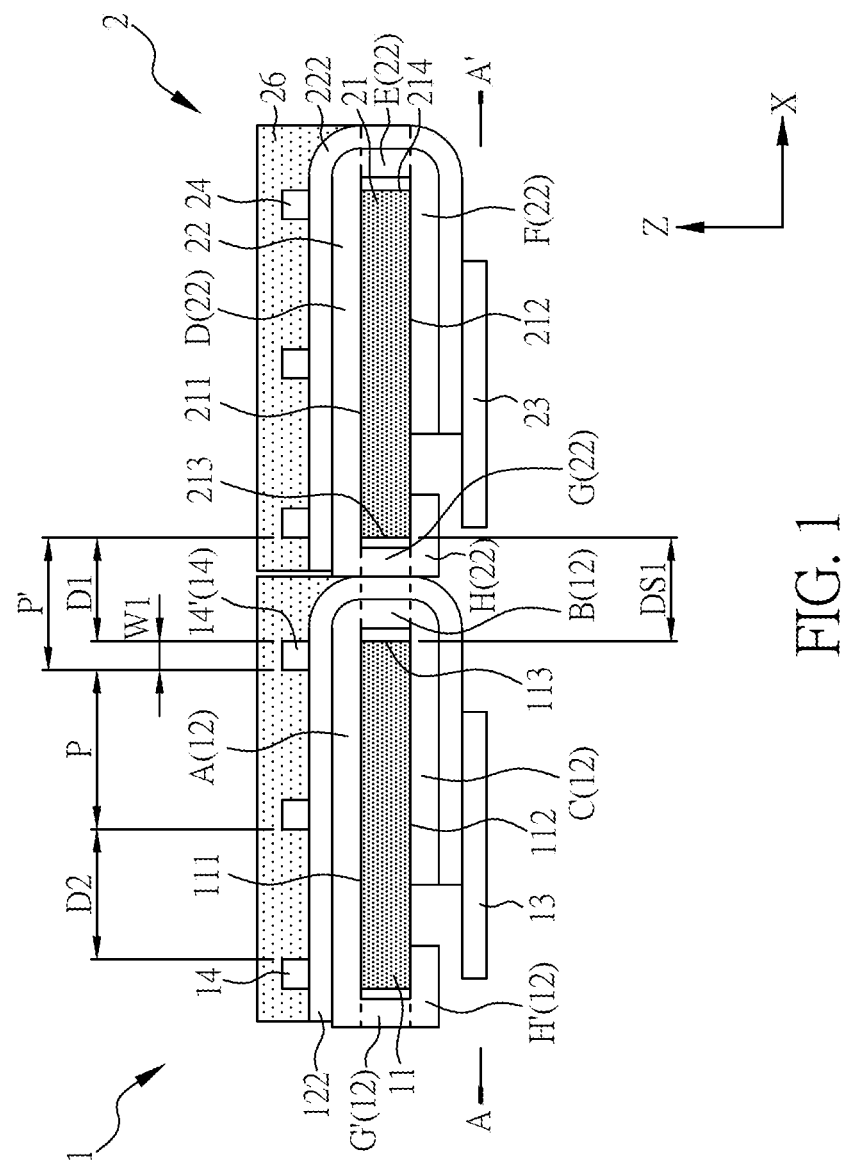
FIG. 1 is a cross-sectional view of a tiled electronic device according to an embodiment of the present disclosure.
Figure 2:
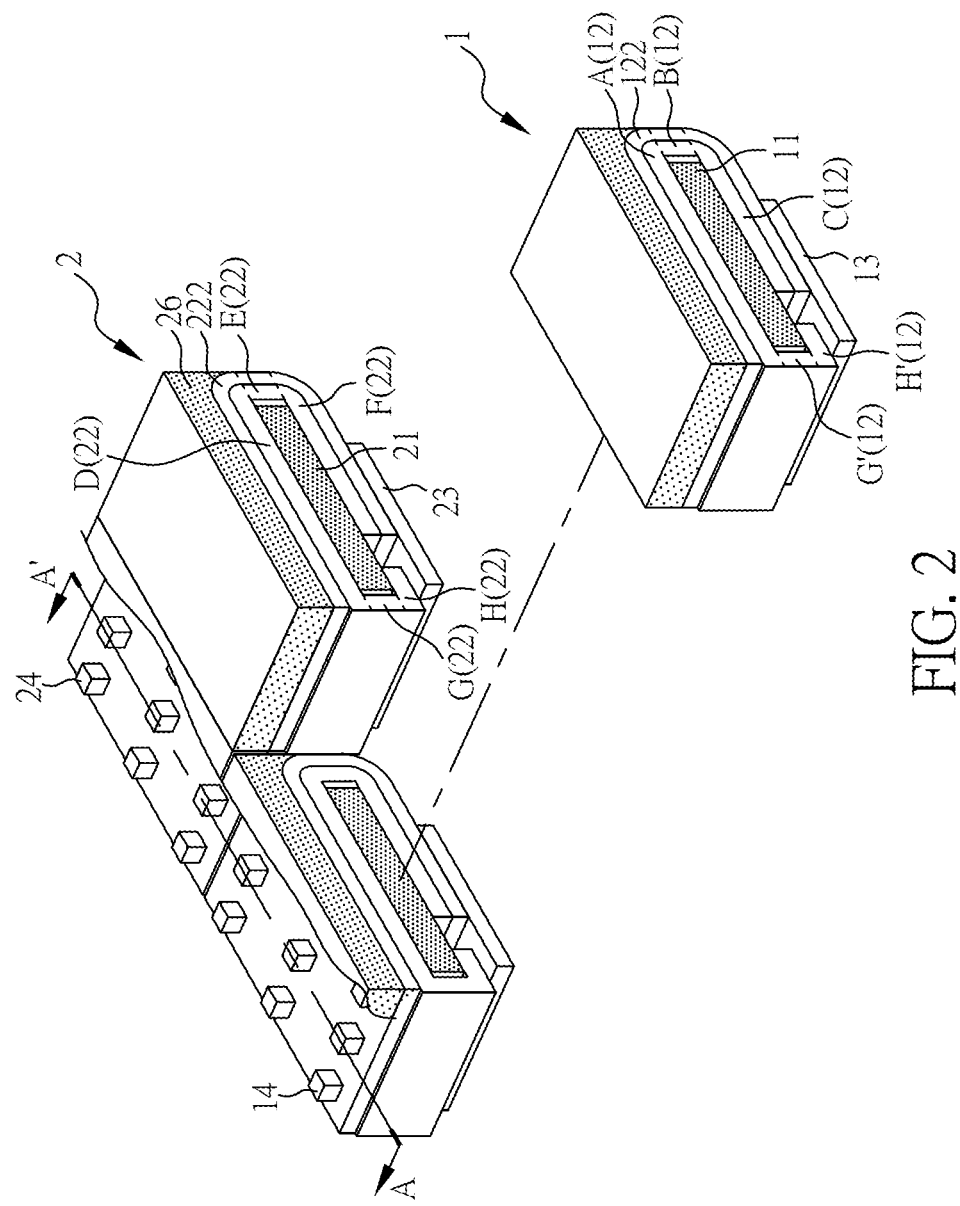
FIG. 2 is a schematic diagram of part of the tiled electronic device according to an embodiment of the present disclosure.

Please refer to FIG. 1 and FIG. 2. FIG. 1 is a cross-sectional view of a tiled electronic device according to an embodiment. FIG. 2 is a schematic diagram of part of the tiled electronic device according to an embodiment. The cross-sectional view of the tiled electronic device of FIG. 1 may be along the line A-A' of FIG. 2. The first electronic device 1 includes a first substrate 11 having a first upper surface 111 and a first lower surface 112 opposite to the first upper surface 111, and a first side surface 113 connected between the first upper surface 111 and the first lower surface 112. The first flexible substrate 12 includes a first upper portion A, a first lower portion C, and a first connection portion B connected between the first upper portion A and the first lower portion C, wherein the first upper portion A is disposed corresponding to the first upper surface 111, the first lower portion C is disposed corresponding to the first lower surface 112, and the first connection portion B is disposed corresponding to the first side surface 113. The second electronic device 2 is disposed adjacent to the first electronic device 1 and includes: a second substrate 21 having a second upper surface 211, a second lower surface 212 opposite to the second upper surface 211, and a second side surface 213 connected between the second upper surface 211 and the second lower surface 212. The second side surface 213 is opposite and adjacent to the first side surface 113, and the first connection portion B is located between the first side surface 113 and the second side surface 213. The aforementioned two side surfaces may be opposite and adjacent to each other. For example, other side surface is not located between the two side surfaces, but other components (for example, adhesive, air, or the like) may be located between the aforementioned two side surfaces.

In some embodiments, the second electronic device 2 further includes a second flexible substrate 22, and the second flexible substrate 22 includes a second upper portion D, a second lower portion F, and a second connection portion E connected between the second upper portion D and the second lower portion F. The second upper portion D is disposed corresponding to the second upper surface 211, and the second lower portion F is disposed corresponding to the second lower surface 212. In some embodiments, the second connection portion E is disposed corresponding to the second side surface 213 and located between the second side surface 213 and the first connection portion B. In some embodiments, the second substrate 21 further includes a third side surface 214 opposite to the second side surface 213, and the third side surface 214 may be connected between the second upper surface 211 and the second lower surface 212. The second connection portion E is disposed corresponding to the third side surface 214 (as shown in FIG. 1), but it is not limited thereto. In addition, as shown in FIG. 1, two extension lines (dotted lines in the figure) respectively extending from the first upper surface 111 of the first substrate 11 and the first lower surface 112 of the first substrate 11 to define the first connection portion B, the first flexible substrate 12 disposed above the extension line or extended corresponding to the first upper surface 111 is defined as the first upper portion A, which is a part of the first flexible substrate 12 disposed on the first upper surface 111.

The first flexible substrate 12 disposed below the extension line or extended corresponding to the first lower surface 112 is defined as the first lower portion C, which is a part of the first flexible substrate 12 disposed under the first lower surface 112. Similarly, the related upper portions, connection portions or lower portions in the following description are defined in the same manner.

The first connection portion B of the first flexible substrate 12 is disposed corresponding to the first side surface 113, the first lower portion C is disposed corresponding to the first lower surface 112, and the first connection portion B is disposed between the first side surface 113 and the second side surface 213. As a result, the first connection portion B may be used as a buffer element to reduce the risk of broken due to a collision when the electronic devices are tiled or transported. By disposing the first connection portion B between the first side surface 113 and the second side surface 213 to reduce some peripheral regions or reduce borders, the peripheral regions may be a bonding region to bend integrated circuits or circuit boards.

In some embodiment, the first substrate 11 and/or the second substrate 21 may include glass substrates, quartz substrates, sapphire substrates, plastic substrates, other suitable substrates, or substrates of mixed materials as illustrated above, but it is not limited. The first substrate 11 (and/or the second substrate 21) may be the same or different materials. In some embodiments, the materials of the first substrate 11 and/or the second substrate 21 may include better heat resistance (for example, small expansion change in high temperature) materials or better humidity resistance (for example, small water absorption change in high humidity) materials. In some embodiments, the first substrate 11 and/or the second substrate 21 may be a substrate having supporting capability or high hardness. In some embodiments, the second flexible substrate 22 and/or the first flexible substrate 12 may include soft substrate with flexibility or thin film, or the material of the second flexible substrate 22 and/or the first flexible substrate 12 may include polycarbonate (PC), polyimide (PI), polypropylene (PP), polyethylene terephthalate (PET), other suitable materials, or a combination thereof, but it is not limited. The second flexible substrate 22 and/or the first flexible substrate 12 may be the same or different materials.

In addition, the first substrate 11 (and/or the second substrate 21) may have a first Young modulus, and the first flexible substrate 12 (and/or the second flexible substrate 22) may have a second Young modulus. In some embodiments, the first Young modulus may be greater than the second Young modulus. In some embodiments, the ratio of the first Young modulus to the second Young modulus may be between 10 and 150, but it is not limited.

In some embodiments, the ratio of the thickness of the first substrate 11 to the thickness of the first flexible substrate 12 may be between 8 and 50 (8≤ratio≤50). Similarly, the ratio of the thickness of the second substrate 21 to the thickness of the second flexible substrate 22 may be between 8 and 50 (8≤ratio≤50). In some embodiments, the thickness of the first substrate 11 (and/or the thickness of the second substrate 21) may be between 25 μm and 25 mm (25 μm≤thickness≤25 mm) In some embodiments, the thickness of the first flexible substrate 12 (and/or the thickness of the second flexible substrate 22) may be between 3 μm and 500 μm (3 μm≤thickness≤500 mm), but it is not limited thereto. In some embodiments, the thickness of the first flexible substrate 12 (and/or the thickness of the second flexible substrate 22) may be between 3 μm and 30 μm (3 μm≤thickness≤30 mm).

In some embodiments, the first electronic device 1 further includes a driving circuit layer 122. The driving circuit layer 122 may be disposed on the first upper portion A, the first lower portion C, and/or the first connection portion B, but it is not limited. In some embodiments, as shown in FIGS. 1 and 2, the first electronic device 1 further includes an integrated circuit (IC) 13 disposed corresponding to the first lower surface 112 and coupled to the driving circuit layer 122. In some embodiments, the coupling represents that two elements may be electrically connected to each other directly, or two elements are electrically connected to each other through other elements. In some embodiments, the integrated circuit 13 may disposed on the first lower portion 112. In some embodiments, the integrated circuit 13 is coupled to the driving circuit layer 122 through a circuit board (such as a flexible circuit board or a rigid circuit board, but it is not limited). In some embodiments, the integrated circuit 13 may disposed between the first lower portion C and the first lower surface 112. In some embodiments, the first electronic device 1 may be disposed on a base plate (not shown) of a tiled device. The base plate may have a groove structure, and the integrated circuit 13 may be disposed in or corresponding to the groove structure of the base plate. In some embodiments, the integrated circuit 13 may be coupled with the driving circuit layer 122 disposed on the first lower portion C. More specifically, the integrated circuit 13 may be adhered to the driving circuit layer 122 by anisotropic conductive film (ACF) or solder paste, but it is not limited.

As shown in FIG. 2, the second electronic device 2 further includes a driving circuit layer 222, and the driving circuit layer 222 is disposed on the second upper portion D, the second lower portion F, and/or the second connection portion E. In some embodiments, the second flexible substrate 22 further includes a third connection portion G. The third connection portion G is connected to the second upper portion D. The third connection portion G is disposed corresponding to the second side surface 213. The third connection portion G may be located between the second side surface 213 and the first connection portion B. In some embodiments, the third connection portion G may be located between the first connection portion B and the second side surface 213. In some embodiments, the second flexible substrate 22 further includes a third lower portion H. The third connection portion G is connected between the second upper portion D and the third lower portion H, and the third lower portion H is disposed corresponding to the second lower surface 212. In some embodiments, the driving circuit layer 222 may be not disposed corresponding to the third connection portion G.

In some embodiments, the second electronic device 2 further includes an integrated circuit 23 disposed corresponding to the second lower surface 212 and coupled to the driving circuit layer 22. In some embodiments, the integrated circuit 23 is disposed on the second lower portion 212. In some embodiments, the integrated circuit 23 is coupled to the driving circuit layer 222 disposed on the second lower portion F. The configuration of the integrated circuit 23 is similar to the configuration of the integrated circuit 13, and the detailed description is deemed unnecessary. The aforementioned driving circuit layer 122 and/or driving circuit layer 222 may include active driving elements (eg, switch transistors, driving transistors, or other transistors), data lines, scan lines, conductive pads, dielectric layers or other circuits, but it is not limited thereto. The material of the data lines, the scan lines, and/or the conductive pads in the driving circuit layer 122 (and/or driving circuit layer 222) is not limited, and the material thereof may include a metal conductive material or a transparent conductive material. The metal conductive material may include copper, aluminum, molybdenum, tungsten, gold, chromium, nickel, platinum, titanium, copper alloy, aluminum alloy, molybdenum alloy, tungsten alloy, gold alloy, chromium alloy, nickel alloy, platinum alloy, titanium alloys, other suitable metal, or a combination thereof, but it is not limited thereto. The transparent conductive material may include indium tin oxide (ITO), indium gallium zinc oxide (IGZO), a combination thereof, or other conductive material with good conductivity or low resistance, but it is not limited thereto.

In some embodiments, the second flexible substrate 22 may further include other connection portions disposed corresponding to other sides of the second substrate 21, and the other sides may be the sides different from the second side 213 and the third side 214, the other sides may be connected to the second side 213 or the third side 214, but it is not limited thereto. The connection portion of the second flexible substrate 22 with the driving circuit layer 222 is called the second connection portion E, and the connection portion without the driving circuit layer 222 is called the third connection portion G. In some embodiments, the second flexible substrate 22 may include at least one second connection portion E. In some embodiments, the second flexible substrate 22 may include at least one second connection portion E, and one of the at least one second lower portion F may be connected to one of the at least one second connection portion E, wherein the second connection portion E may be connected between the second upper portion D and the second lower portion F. In some embodiments, the second flexible substrate 22 may include at least one third connection portion G. In some embodiments, the second flexible substrate 22 may include at least one third connection portion G, and one of the at least one third lower portion H may be connected to one of the at least one third connection portion G, wherein the third connection portion G may be connected between the second upper portion D and the third lower portion H.

As shown in FIG. 2, in some embodiments, the first flexible substrate 12 is similar to the second flexible substrate 22. The first flexible substrate 12 may include at least one fourth connection portion G'. The fourth connection portion G' may be connected to the first upper portion A. In some embodiments, the first flexible substrate 12 includes at least one fourth lower portion H'. One of the at least one fourth connection portion G' is connected between the first upper portion A and one of the at least fourth lower portion H'. The fourth lower portion H' may be disposed corresponding to the first lower surface 112. In some embodiments, the driving circuit layer 122 is disposed not corresponding to the fourth connection portion G'. The connection portion of the first flexible substrate 12 with the driving circuit layer 122 is called the first connection portion B, the connection portion of the first flexible substrate 12 without the driving circuit layer 122 is called the fourth connection portion G'. In some embodiments, the flexible substrate 12 may include at least one first connection portion B. In some embodiments, the first flexible substrate 12 may include at least one first connection portion B, and one of the at least one first lower portion C may be connected to one of the at least one first connection portion B, wherein the first connection portion B may be connected between the first upper portion A and the first lower portion C. In some embodiments, the first flexible substrate 12 may include at least one fourth connection portion G'. In some embodiments, the first flexible substrate 12 may include at least one fourth connection portion G', and one of the at least one fourth lower portion H' may be connected to one of the at least one fourth connection portion G, wherein the fourth connecting portion G' may be connected between the first upper portion A and the fourth lower portion H'.

In some embodiments, the second connection portion E may be disposed corresponding to the second side surface 213. More specifically, the second connection portion E connected to the second lower portion F may be located between the first connection portion B and the second side surface 213, wherein the second lower portion F may be coupled to the integrated circuit 23. In some embodiments, the integrated circuits of the first electronic device 1 and the second electronic device 2 may be arranged in a mirroring manner, but it is not limited thereto. A detailed description therefor is given subsequently with reference to FIG. 6.

As shown in FIG. 1, the first electronic device 1 includes a plurality of first electronic units 14 disposed on the first upper surface 111, and the second electronic device 2 includes a plurality of second electronic units 24 disposed on the second upper surface 211. The first electronic units 14 have an edge electronic unit 14' adjacent to the second electronic device 2, and a first distance D1 may be defined by a distance between the edge electronic unit 14' and one of the second electronic units 24 closest to the edge electronic unit 14. A substrate spacing DS1 defined by a distance between the first side surface 113 and the second side surface 213 may be less than or equal to the first distance D1. More specifically, a minimum distance between one the first electronic unit 14 closest to the second side surface 213 (i.e., the edge electronic units 14') and one of the second electronic units 24 closest to the edge electronic units 14' in the first direction X may be defined as a first distance D1. A maximum distance between the first side surface 113 and the second side surface 213 in the first direction X may be defined as the substrate spacing DS1. It is noted that, the first direction X may have different defined manner in different situations. In some situations the first direction may be defined by an arranged direction of the first electronic device 1 and the second electronic device 2. In other words, the first electronic device 1 and the second electronic device 2 may be arranged along the first direction X. In some embodiments, an included angle between the first side surface 113 and the first upper surface 111 may be a right angle (an angle may be in a range from 85 degrees to 95 degrees), and the first direction X may be defined by a normal direction of the first side surface 113. In other words, an included angle between the first side surface 113 and the first upper surface 111 is not a right angle, and a connection corner edge may be between the first side surface 113 and the first upper surface 111, a direction is perpendicular to an extending direction of the connection corner edge and parallel to the first upper surface 111 may be defined as the first direction X. Alternatively, in some embodiments, the connection corner edge has an arc shape or an irregular edge, or the first electronic device 1 and the second electronic device 2 may be arranged in a staggered manner (for example a mosaic arrangement), the center point of the first upper surface 111 of the first electronic device 1 and the center point of the second upper surface 211 of the second electronic device 2 may be substantially connected to form a virtual connection line, and an extending direction of the virtual connection line may be defined as the first direction X.

In some embodiments (FIG. 1 and FIG. 2), a plurality of first electronic units 14 may be disposed on the first upper portion A, and a plurality of second electronic units 24 may be disposed on the second upper portion D.

In addition, a second distance D2 is between two adjacent ones of the first electronic units 14 of the first electronic device 1, and the ratio of the first distance D1 to the second distance D2 may be between 0.9 and 1.1 ($0.9 \leq D1/D2 \leq 1.1$). In some embodiments, the ratio of the first distance D1 to the second distance D2 is between 0.95 and 1.05 ($0.95 \leq D1/D2 \leq 1.05$). In some embodiments, the ratio of the first distance D1 to the second distance D2 is between 0.97 and 1.03 ($0.97 \leq D1/D2 \leq 1.03$). In some embodiments, the ratio of the first distance D1 to the second distance D2 is between 0.98 and 1.02 ($0.98 \leq D1/D2 \leq 1.02$). In some embodiments, the difference between the first distance D1 and the second distance D2 may be within 10%. In some embodiments, the difference between the first distance D1 and the second distance D2 may be within 5%. In some embodiments, the difference between the first distance D1 and the second distance D2 may be within 3%. In some embodiments, the difference between the first distance D1 and the second distance D2 may be within 2%. A minimum distance between two adjacent ones of the first electronic units 14 (or second electronic units 24) in the first direction X may be defined as a second distance D2. With the design of the aforementioned relation between the first distance D1 and the second distance D2, the tiled electronic device can reduce border (or seam). In addition, the first electronic units 14 and/or the second electronic units 24 may have an electronic unit width W1. The electronic unit width W1 may be defined by a maximum width of the first electronic unit 14 and/or the maximum width of the second electronic unit 24 in the first direction X. In some embodiments, the first electronic device 1 and/or the second electronic device 2 may be a display device, the first electronic unit 14 and/or the second electronic unit 24 may include a plurality of light-emitting units. The light-emitting units may emit lights with the same or different colors (or wavelengths). For example, the first electronic unit 14 and/or the second electronic unit 24 may include a blue light-emitting unit, a green light-emitting unit or a red light-emitting unit, but it is not limited thereto. In some embodiments, the first electronic unit 14 and/or the second electronic unit 24 may include white light-emitting unit or other color light-emitting unit. The first electronic unit 14 and/or second electronic unit 24 can circumscribe a minim rectangular outer frame profile, and the maximum width of the outer frame profile in the first direction X may be defined as the electronic unit width W1.

In some embodiments, the blue light-emitting unit, the green light-emitting unit or the red light-emitting unit may include at least one light-emitting element (not shown). In a miniature light-emitting diode (micro light-emitting diode or mini light-emitting diode) electronic device, the light-emitting unit area of the light-emitting unit with different color (or wavelengths) may be defined by a package cup, and the miniature light-emitting diode may be disposed in the package cup. At least one light-emitting element with the same color may be disposed in one package cup, but it is not limited thereto. In some embodiments, in a miniature light-emitting diode electronic device, the light-emitting unit area of the light-emitting units with different colors (or wavelengths) may be defined by the opening of the light shielding layer, and the material of the light shielding layer may include a black matrix (BM) layer or a glue layer with light-shielding property (cured), but it is not limited thereto. In an organic light-emitting diode electronic device, the light-emitting unit area of light-emitting unit with different color (or wavelengths) may be defined by a pixel definition layer (PDL), but it is not limited thereto. In some embodiments, in a liquid crystal electronic device, the light-emitting unit area of the light-emitting unit with different color (or wavelengths) may be defined by the opening of the light shielding layer, the material of the material may include a black matrix (BM) layer or a material layer with light shielding capability, or the light-emitting unit area of the light-emitting unit with different color (or wavelengths) may be defined by a region surrounded by adjacent scan lines and adjacent data lines, but it is not limited thereto.

A unit pitch P may be a distance between two adjacent ones of the first electronic units 14 with the same color (such as blue, green or red), and the unit pitch P may be defined by a distance between one position (such as end point or center point) of the first electronic units 14 and the corresponding position of the adjacent first electronic unit 14 in the direction X. As described above, a first unit pitch P' may be defined by a distance between an edge electronic unit 14' closest to the second electronic device 2 and the second electronic unit 24 closest to the edge electronic unit 14', both with the same color. The first unit pitch P' may be defined by a distance between one position (such as one point or center point) of the edge electronic unit 14' and the corresponding position of the adjacent second electronic unit 24 closest to the edge electronic unit 14' in the direction X. In some embodiments, the ratio of the first unit pitch P' to the unit pitch P may be between 0.9 and 1.1 ($0.9 \leq P'/P \leq 1.1$). In some embodiments, the ratio of the first unit pitch P' to the unit pitch P may be between 0.95 and 1.05 ($0.95 \leq P'/P \leq 1.05$). In some embodiments, the ratio of the first unit pitch P' to the unit pitch P may be between 0.97 and 1.03 ($0.97 \leq P'/P \leq 1.03$). In some embodiments, the ratio of the first unit pitch P' to the unit pitch P may be between 0.98 and 1.02 ($0.98 \leq P'/P \leq 1.02$). In some embodiments, the difference between the first unit pitch P' and the unit pitch P may be within 10%. In some embodiments, the difference between the first unit pitch P' and the unit pitch P may be within 5%. In some embodiments, the difference between the first unit pitch P' and the unit pitch P may be within 3%. In some embodiments, the difference between the first unit pitch P' and the unit pitch P may be within 2%. With the design of the aforementioned relation between the first unit pitch P' and the unit pitch P, the tiled effect can be reduced.

It is noted that, the comparison of the aforementioned relation between the first unit pitch P' and the unit pitch P has to be done under the same definition (such as same color and same position). For example, a distance between the positions (such as center points) of two adjacent ones of the first electronic units 14 with the same color (such as blue color) in the first direction X is defined as a unit pitch P, and the first unit pitch P' may be defined by a distance between the center point of the edge electronic unit 14' with blue color and the center point of the second electronic unit 24 closest to the edge electronic unit 14' with blue color.

In addition, the substrate spacing DS1 can be designed to satisfy the following formula: $DS1+W1 \leq P$, the tiled electronic device can reduce the effect of the borders.

The aforementioned first electronic device 1 or second electronic device 2 includes a display device, an antenna device, a detection (or sensing) device, a backlight device, or the like. When being applied to different situations, the structure of the electronic device may be adjusted according the actual requirement, but it is not limited thereto.

When the first electronic device 1 or the second electronic device 2 is an antenna device, it may be a device for transmitting or receiving radio waves or radiation. When the first electronic device 1 or the second electronic device 2 is a display device, it may be used to display a screen or an image. When the first electronic device 1 or the second electronic device 2 is a detection (or sensing) device, it may be a device for detecting light (X-ray, infrared light, or visible light, but not limited), or recognizing biological representations (fingerprints, faces, pupils, but it is not limited thereto).

The aforementioned electronic device may be the type of a liquid crystal (LC), an organic light-emitting diode (OLED), a quantum dot organic light-emitting diode (QOLED), quantum dot (QD), fluorescence material, phosphor material, light-emitting diode (LED), miniature light-emitting diode (micro light-emitting diode or mini light-emitting diode) or other material, but it is not limited thereto. In some embodiments, the first electronic unit 14 and/or the second electronic unit 24 may include a miniature light-emitting diode (micro light-emitting diode or mini light-emitting diode). The first electronic device 1 and/or the second electronic device 2 may be an active matrix (AM) operated electronic device. For example, the first electronic units 14 of the first electronic device 1 are provided with respect active driving elements, and different active driving elements may respectively control the on/off operations of the first electronic units 14, but it is not limited thereto.

In some embodiments, the first electronic unit 14 and/or the second electronic unit 24 includes a micro light-emitting diode, the first electronic device 1 and/or the second electronic device 2 may include a package structure 26 for protecting the first electronic unit 14 (or the second electronic unit 24) from external moisture, air, or impact of other external forces to affect the display quality, but it is not limited thereto. The shape of the package structure 26 is not limited to that shown in the drawings. In some embodiments, the package structure 26 may be disposed on the first electronic unit 14 (or the second electronic unit 24) along the structure of the first electronic unit 14 (or the second electronic unit 24). In some embodiments, the package structure 26 may be correspondingly disposed on (or cover) the first upper surface 111 of the first electronic unit 14, but it is not limited thereto. In some embodiments, the package structure 26 may be disposed along the first flexible circuit board 12, but it should be noted that, the package structure 26 may expose at least part of the driving circuit layer 122 correspondingly disposed on the first lower portion C. The exposed driving circuit layers 122 may be coupled to the integrated circuit 13. In some embodiments, the package structure 26 may have different thicknesses. In some embodiments, an additional cover substrate (not shown) may be disposed on the package structure 26, and the package structure 26 may be used as a filling layer. The package structure 26 may include insulating material, which does not affect the short circuit between the first electronic units 14.

Figure 3:
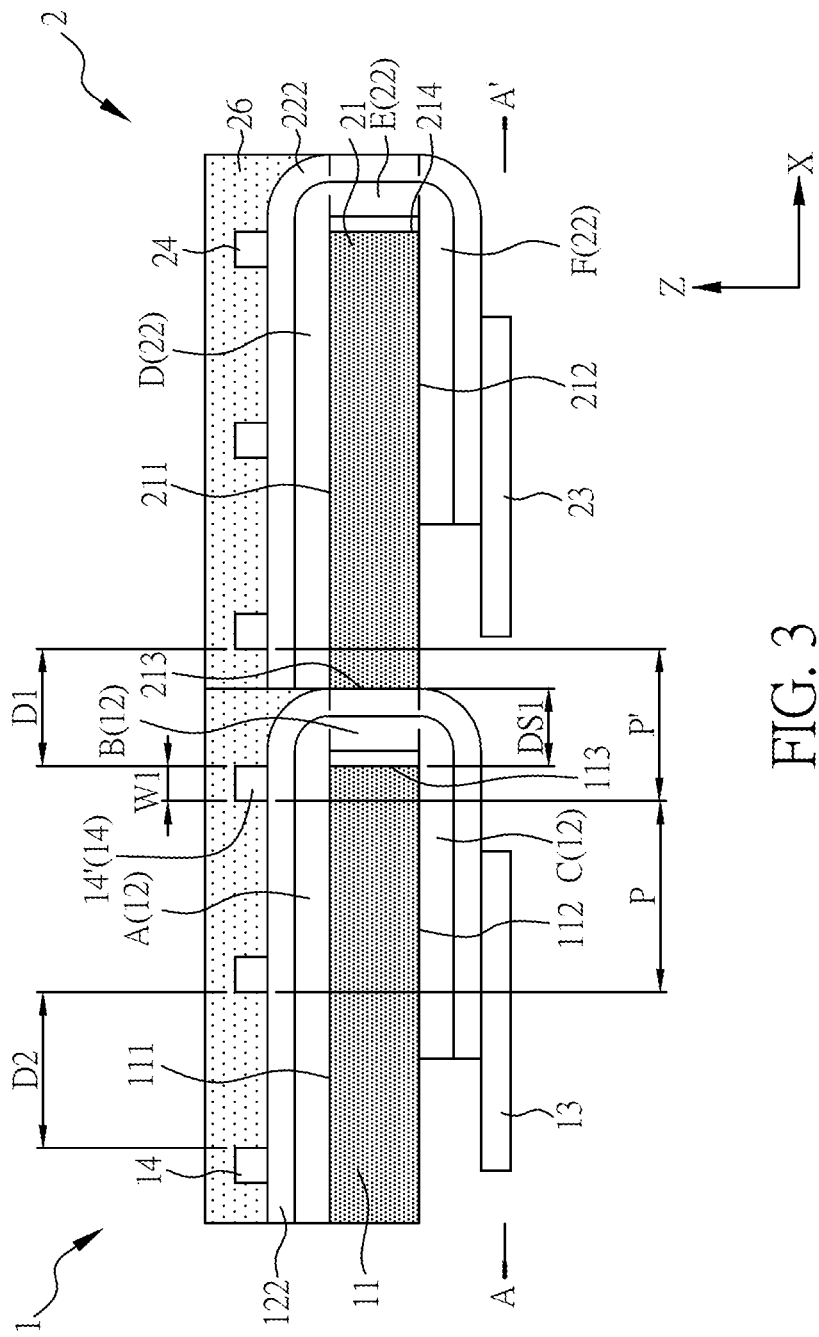
FIG. 3 is a cross-sectional view of a tiled electronic device according to an embodiment of the present disclosure.

FIG. 3 is a cross-sectional view of a tiled electronic device according to an embodiment, which is similar to that of FIG. 1 except that the second flexible substrate 22 does not have the third connection portion G, and the first flexible substrate 12 does not have the fourth connection portion G'. More specifically, the second flexible substrate 22 may not be disposed between the second side surface 213 of the second substrate 21 and the first side surface 113 of the first substrate 11. In some embodiments, the second side surface 213 may contact with the first connection portion B of the first flexible substrate 12, but it is not limited thereto. In some embodiments, the first connection portion B of the first flexible substrate 12 has other components (for example a protective layer or an adhesive member, but not limited), the second side surface 213 may contact with other components disposed on the first connection portion B. In some embodiments (FIG. 1 to FIG. 3), the first electronic unit 14 (and/or the second electronic unit 24) may be substantially aligned with the first side surface 113 (and/or the second side surface 213) in a second direction Z, but it is not limited thereto, the aforementioned alignment indicates that the side of one of the first electronic unit 14 (and/or the second electronic unit 24) substantially overlaps with the first side surface 113 (and/or the second side surface 213) in a second direction Z, and the second direction Z is defined by the normal direction of the first upper surface 111, but it is not limited thereto.

Figure 4:
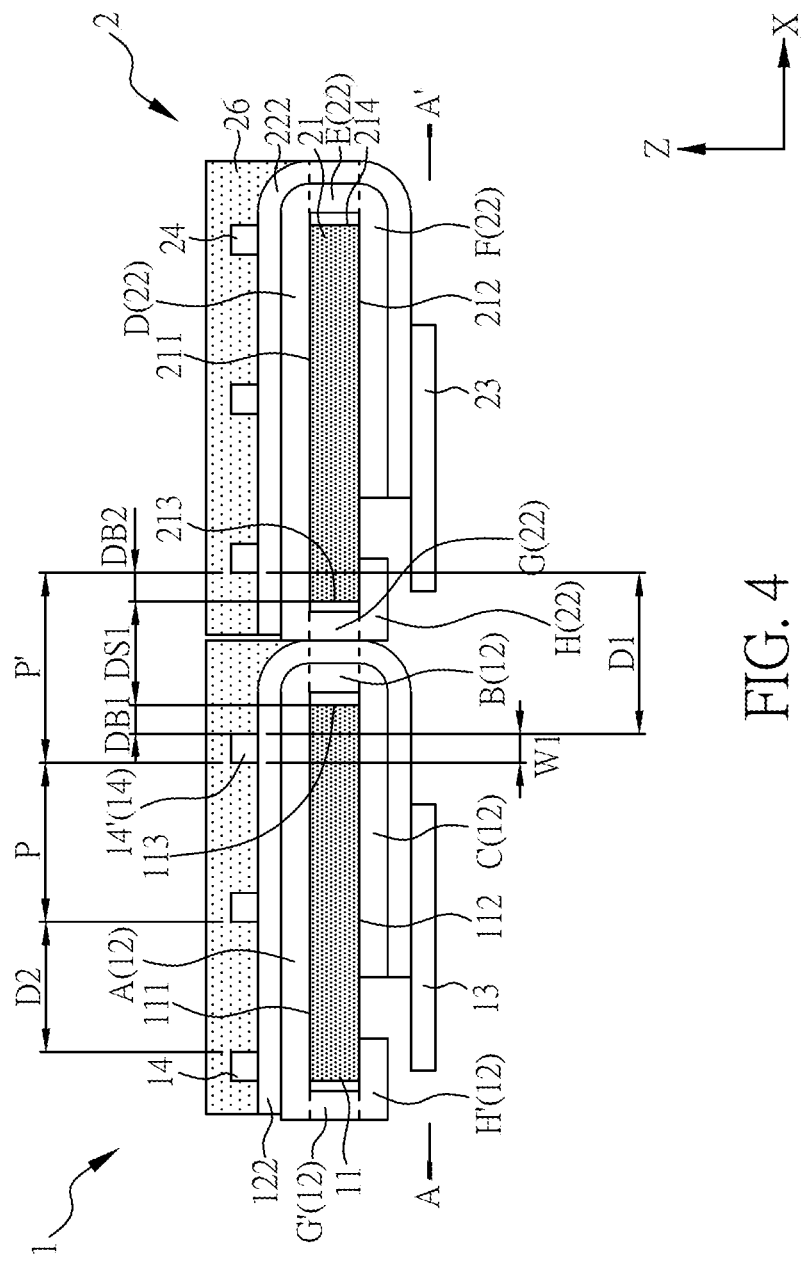
FIG. 4 is a cross-sectional view of a tiled electronic device according to an embodiment of the present disclosure.

FIG. 4 is a cross-sectional view of a tiled electronic device according to an embodiment, which is similar to the tiled electronic device of FIG. 1 except a first edge distance DB1 and a second edge distance DB2, the first edge distance DB1 is defined by a maximum distance between the edge electronic unit 14' (one of the first electronic units 14 closest to (most adjacent to) the second side surfaces 213) and the first side surface 113 in the first direction X. Similarly, a second edge distance DB2 is defined by a maximum distance between one of the second electronic units 24 closest to (most adjacent to) the first side surfaces 113 and the second side surface 213 in the first direction X. The term "most adjacent" may be one of the plurality of first electronic units 14 in a local area that is closest to the second side surfaces 213 and/or one of the plurality of second electronic units 24 that is closest to the first side surface 113. As shown in the embodiment of FIG. 4, the substrate spacing DS1 can be designed to satisfy the following formula: DS1+W1+DB1+DB2≤P, and the tiled electronic device can reduce the effect of the borders.

Figure 5:
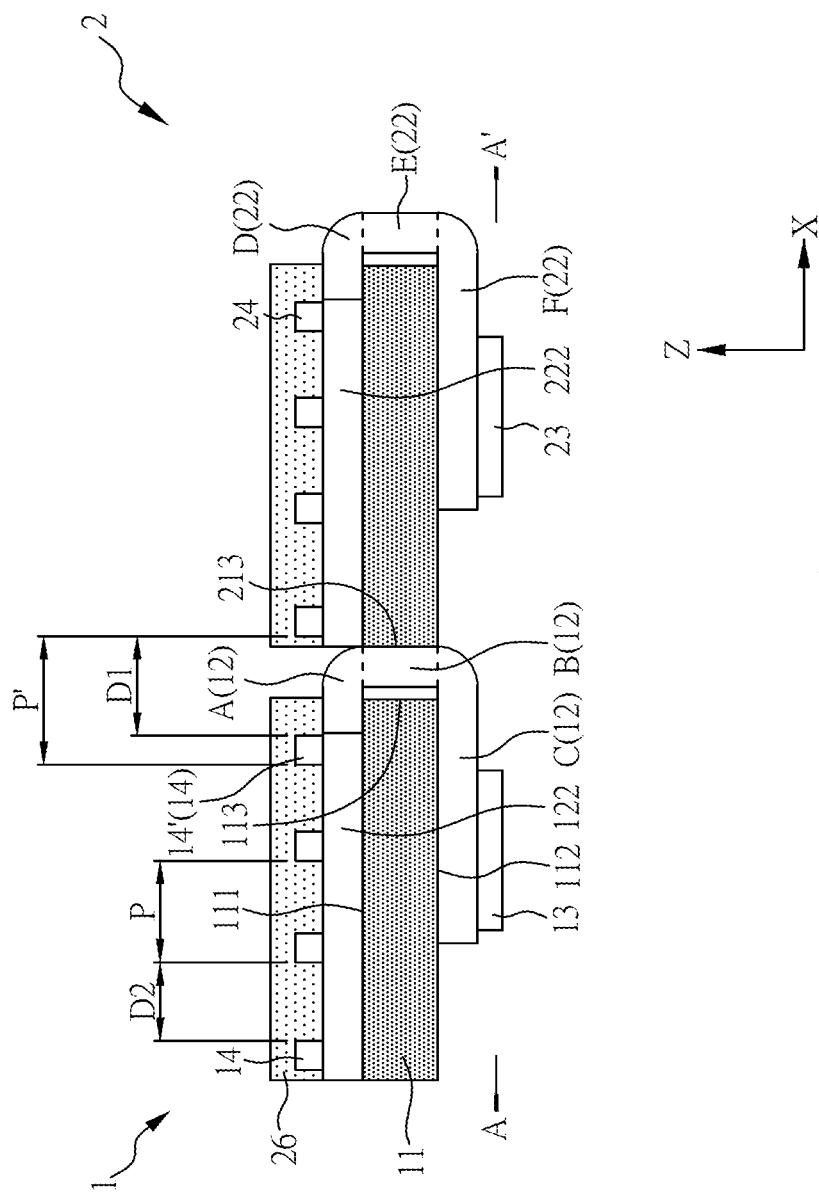
FIG. 5 is a cross-sectional view of a tiled electronic device according to an embodiment of the present disclosure.

FIG. 5 is a cross-sectional view of a tiled electronic device according to an embodiment, which is similar to the tiled electronic device of FIG. 3 except that the driving circuit layer 122 is disposed on the first upper surface 111 of the first substrate 11, and the circuit (not shown) disposed on the first flexible substrate 12 may be coupled to the first electronic units 14 through the driving circuit layer 122. The first electronic units 14 may be disposed on the first upper surface 111 and coupled to one of a plurality of switching transistors (not shown) of the driving circuit layer 122 respectively. The unit 14 may be coupled to one of a plurality of scan lines (not shown) of the driving circuit layer 122 and one of a plurality of data lines (not shown) of the driving circuit layer 122. In detail, the driving circuit layer 122 may include a plurality of conductive pads (not shown) disposed on the first upper surface 111 and adjacent to the first side surface 113, and the circuit disposed on the first flexible substrate 12 includes a plurality of conductive pads (not shown). The plurality of conductive pads disposed on the first upper surface 111 and the plurality of conductive pads disposed on the first flexible substrate 12 may be coupled to each other.

In some embodiments, an adhesive element is disposed between the conductive pad disposed on the first upper surface 111 and the conductive pad disposed on the first flexible substrate 12. The adhesive element may be anisotropic conductive adhesive (ACF), acrylic resin, acrylic polyol resin, or other suitable resin. The adhesive element may include gold (Au), nickel (Ni), lead (Pd), silver (Ag), copper (Cu), tin (Sn), other suitable metals or conductive materials, or a combination thereof, but it is not limited thereto. In some embodiments, a solder material is disposed between the conductive pad disposed on the first upper surface 111 and the conductive pad disposed on the first flexible substrate 12. The solder material may include gold (Au), nickel (Ni), lead (Pd), silver (Ag), copper (Cu), tin (Sn), other suitable metals or conductive materials, or a combination thereof, but it is not limited thereto.

In the embodiment of FIG. 5, the first upper portion A of the first flexible substrate 12 may be correspondingly disposed on the first upper surface 111 adjacent to the first side surface 113, and the first connection portion B and the first lower portion C of the first flexible substrate 12 are still disposed respectively corresponding to the first side surface 113 and the first lower surface 112, so that the first connection portion B is disposed between the first side surface 113 and the second side surface 213. With the arrangement of the first connection portion B and the first lower portion C, the effect of seam can be reduced. In some embodiments (FIG. 5), the first flexible substrate 12 is a flexible printed circuit (FPC). The first flexible substrate 12 may include integrated circuits or conductive wires, but it is not limited thereto. In some embodiments, the driving circuit layer 122 is disposed on the first upper surface 111 of the first substrate 11, and the first flexible substrate 12 may not include the first upper portion A, the first flexible substrate 12 may include the first connection portion B and/or the first lower portion C. In this embodiment, the driving circuit layer 122 may be disposed on part of the first side surface 113.

Figure 6:
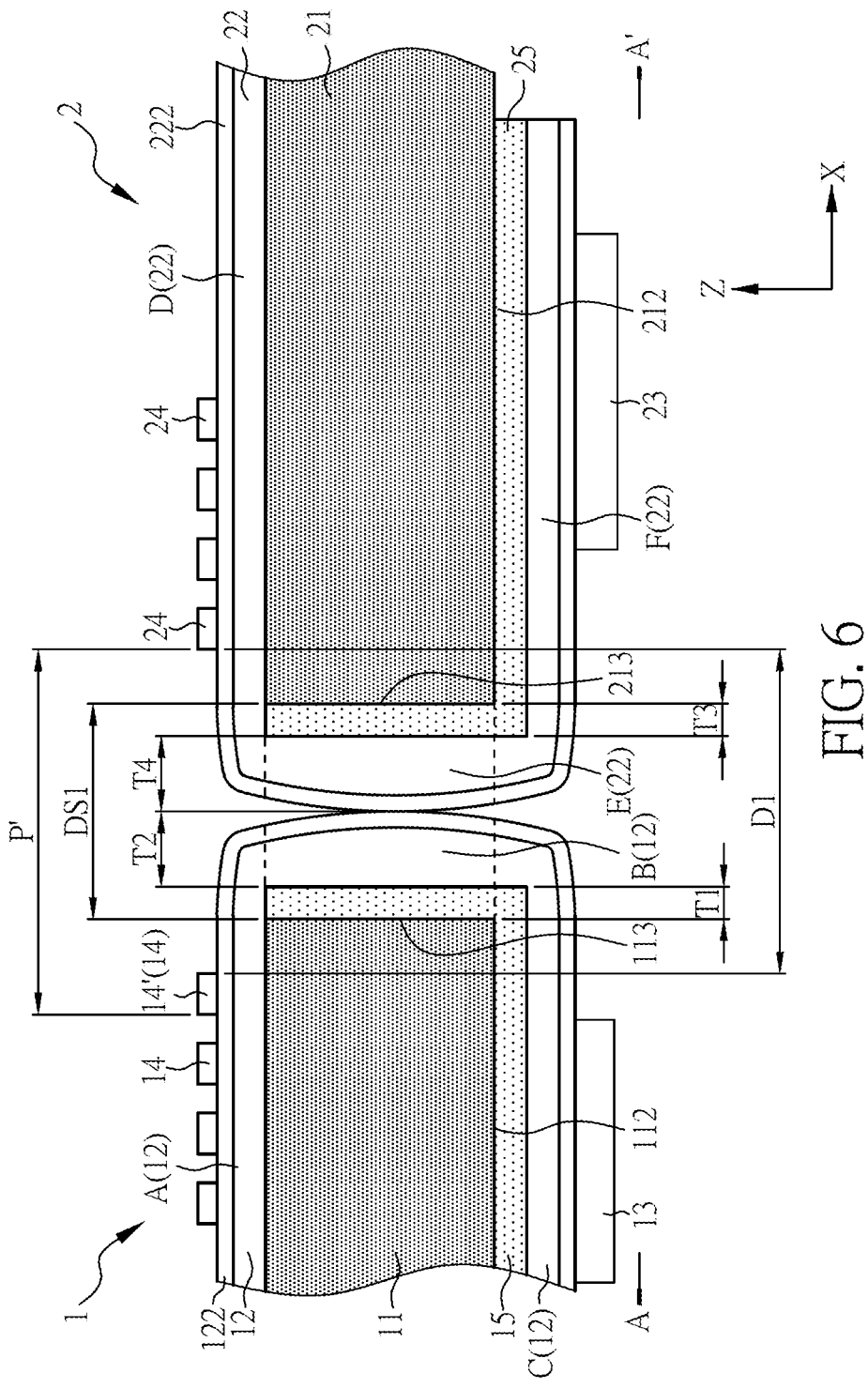
FIG. 6 is a cross-sectional view of part of the tiled electronic device according to an embodiment of the present disclosure.

FIG. 6 is a cross-sectional view of part of the tiled electronic device according to an embodiment (FIG. 6), the tiled electronic device is similar to that of FIG. 1 except that the first electronic device 1 includes a first adhesive member 15, which may be disposed between the first side surface 113 and the first connection portion B. A difference between FIG. 6 and FIG. 1 is that the position of the second connection portion E (and the position of the second lower portion F) is different. For example, the second connection portion E may be located between the first side surface 113 and the second side surface 213. In some embodiments, the first adhesive member 15 may be disposed between the first lower portion C and the first lower surface 112. In some embodiments, the first adhesive member 15 may be disposed between the first side surface 113 and the first connecting portion B, and the first adhesive member 15 may be disposed between the first lower portion C and the first lower surface 112. In some embodiments, air may be located between the first side surface 113 and the first connection portion B. In some embodiments, the first adhesive member 15 may contact with at least one of the first side surface 113 and the first lower surface 112. In some embodiments, the first adhesive member 15 may be continuously or discontinuously disposed between the first substrate 11 and the first flexible substrate 12, and the first adhesive member 15 may include the same or different adhesive materials. When the first adhesive member 15 is disposed between the first lower surface 112 and the first lower portion C, the first lower portion C can be positioned (or fixed) to reduce a damage of the integrated circuit 13 disposed on the first lower portion C in a process of moving the first lower portion C, or reduce deformation of the first flexible substrate 12 in process of moving the first lower portion C. For example, the first connection portion B may be deformed or broken in process of moving the first lower portion C. Disposing the first adhesive member 15 between the first lower surface 112 and the first lower portion C is able to increase the yield of tiling the first electronic device 1 and/or the second electronic device 2. In addition, the first adhesive member 15 disposed between the first side surface 113 and the first connection portion B can increase the adhesion between the first flexible substrate 12 and the first substrate 11, so as to reduce the gap existed between the first connection portion B and the first side surface 113, the gap may deform or break the shape of the first connection portion B by an external force impact (or collision) to affect the upper driving circuit layer or degrade the operation quality.

In some embodiments, the first adhesive member 15 may have a first thickness T1 in the first direction X, and the first thickness T1 is defined by a maximum thickness of the first adhesive member 15 in the first direction X. In some embodiments, the first thickness T1 may be less than 300 micrometers (μm), but it is not limited thereto. In some embodiments, the first thickness T1 may be less than 100 microns (μm).

In some embodiments, the first connection portion B with the driving circuit layer 122 has a second thickness T2 in the first direction X, and the second thickness T2 may be defined by a maximum thickness of the first connection portion B in the first direction X. In some embodiments, the first upper portion A of the first flexible substrate 12 and the first connection portion B of the first flexible substrate 12 have different thicknesses. In some embodiments, the first lower portion C of the first flexible substrate 12 and the first connection portion B of the first flexible substrate 12 have different thicknesses. In some embodiments, the first connection portion B may have a plurality of thicknesses in the first direction X. In some embodiments, the first connection portion B may have two end portions respectively connected to the first lower portion C and the first upper portion A, and a middle portion connected to the two end portions. A thickness of the middle portion in the first direction X is greater than a thickness of the two end portions of the first connection portion B in the first direction X. In some embodiments, the thickness of the first connection portion B is greater than the thickness of the first upper portion A for reducing the risk of the first connection portion B being broken by an external force impact. In some embodiments, the thickness of the first connection portion B is less than the thickness of the first upper portion A, and the border of the electronic device can be reduced. The thickness of the first connection portion B can be appropriately adjusted according to the actual requirement.

In some embodiments, the third connection portion G of the second flexible substrate 22 is not disposed between the first side surface 113 and the second side surface 213, the second side surface 213 may contact with directly the first connection portion B. In some embodiments, the substrate spacing DS1 may approximately satisfy the following formula: DS1=T1+T2, but it is not limited thereto.

Another difference between the tiled electronic devices of FIG. 6 and FIG. 1 is that the second connection portion E is disposed at different positions. As shown in the embodiment of FIG. 6, the second electronic device 2 may be similar to the first electronic device 1, but the integrated circuit is disposed in a mirroring manner, and the second connection portion E of the second electronic device 2 is disposed corresponding to the second side surface 213. For example, a second connection portion E of the second flexible substrate 22 may be disposed between the first side surface 113 and the second side surface 213, and the second lower portion F is connected to the second connection portion E, and the second lower portion F is disposed corresponding to the second lower surface 212, wherein the integrated circuit 13 is coupled to the second lower portion F. The second electronic device 2 may include a second adhesive member 25, and the second adhesive member 25 may be disposed between the second side surface 213 and the second connection portion E. In some embodiments, the second adhesive member 25 may have a third thickness T3 in the first direction X, and the third thickness T3 is defined by a maximum thickness of the second adhesive member 25 in the first direction X. The second connection portion E with the driving circuit layer 222 has a fourth thickness T4 in the first direction X. The fourth thickness T4 is defined by the maximum thickness of the second connection portion E in the first direction X. In some embodiments, the substrate spacing DS1 may approximately satisfy the following formula: DS1=T1+T2+T3+T4, but it is not limited thereto. In the aforementioned example, the thickness of the driving circuit layer 222 may be thinner than the thickness of the first connection portion B and/or the second connection portion E. For example, the ratio of the thickness of the driving circuit layer 122 (and/or the thickness of the driving circuit layer 222) to the thickness of the first connection portion B (and/or thickness of the second connection portion E) is less than 0.05 (ratio≤0.05), but it is not limited thereto.

The first adhesive member 15 and/or the second adhesive member 25 may include a double-sided tape, silica gel, a light curing adhesive (eg, a UV adhesive), an epoxy adhesive, an acrylic adhesive, a moisture curing adhesive, the optical clear adhesive (OCA), an optical clear resin (OCR), or other polymers or a combination thereof, but it is not limited thereto. The material of the first adhesive member 15 and the material of the second adhesive member 25 may be the same or different, but it is not limited thereto. In some embodiments, the first adhesive member 15 may include at least two portions, and the materials of different portions of the first adhesive member 15 may be the same or different. In some embodiments, the first adhesive member 15 may include at least two portions, and air may be disposed between the two portions. In some embodiments, the first adhesive member 15 may be disposed or adhered between the first side surface 113 and the first connection portion B, a light curing adhesive (such as a UV light curing adhesive) or a heat curing adhesive, and the first adhesive member 15 adhered between the first lower surface 112 and the first lower portion C can be a double-sided tape, a light curing adhesive (such as a UV light curing adhesive) or a heat curing adhesive, but it is not limited thereto. In some embodiments, the first adhesive member 15 is not disposed between the first side surface 113 and the first connection portion B, and the first adhesive member 15 may be adhered between the first lower surface 112 and the first lower portion C. The first adhesive member 15 can be a double-sided adhesive tape, a light curing adhesive (including a UV light curing adhesive) or a heat curing adhesive.

Figure 7:
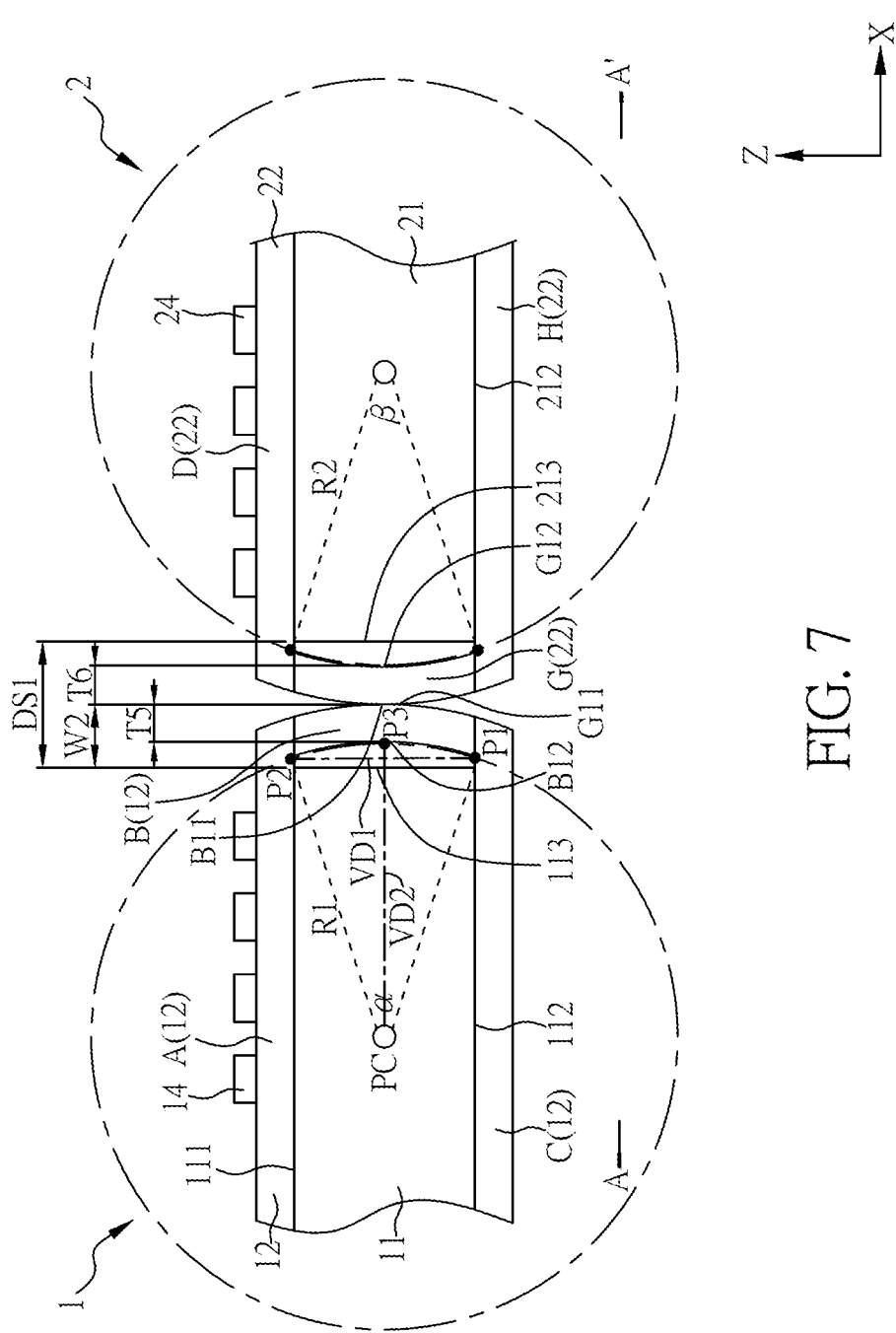
FIG. 7 is a cross-sectional view of part of the tiled electronic device according to an embodiment of the present disclosure.

FIG. 7 is a cross-sectional view of part of the tiled electronic device according to an embodiment of the present disclosure. The tiled electronic device of FIG. 7 is similar to those of FIG. 1 to FIG. 5 except that the first connection portion B of the first flexible substrate 12 has a curved structure. In some embodiments, the curved structure of the first connection portion B may have different thicknesses in the first direction X. In some embodiments, the first connection portion B with the driving circuit layer 122 may have a fifth thickness T5 in the first direction X. The fifth thickness T5 is defined by a maximum thickness of the first connection portion B with the driving circuit layer 122 in the first direction X. The first connection portion B has a first portion outer surface B11 away from the first side surface 113 and a first portion inner surface B12 adjacent to the first side surface 113. The first portion outer surface B11 is opposite to the first portion inner surface B12. The first portion inner surface B12 may have a first curvature radius R1 and a first arc opening angle α. The first curvature radius R1 is defined by follows. Two points (intersection point P1 and intersection point P2) may be formed by intersecting the first portion inner surface B12 with the first upper portion A and the first lower portion C, a circle may substantially be formed between intersection point P1 and intersection point P2 along the first portion inner surface B12 (see FIG. 7) to obtain the first curvature radius R1 and the first arc opening angle α. Alternatively, a first virtual line VD1 is defined by connecting the intersection point P1 to the intersection point P2, and a second virtual line VD2 perpendicular to the first virtual line VD1 may be intersected with the first portion inner surface B12 at an intersection point P3, and the second virtual line VD2 is intersected with the center of the first virtual line VD1. At this moment, a circle may substantially be formed along the intersection point P1, the intersection point P2 and the intersection P3, and the circle has a circle center point PC. In this case, the circle center point PC has a curvature radius R1, and an arc opening angle α, the arc opening angle α may be defined by an angle between a line connected the circle center point PC and the intersection point P1 and a line connected the circle center point PC and the intersection point P2. In addition, a first width W2 is defined by a maximum width between the first side surface 113 and the first portion outer surface B11 in the first direction X. In this case, the first width W2 satisfies the following formula: W2=R1 (1−cos (α/2))+T5. In some embodiments, the first adhesive member 15 as described above disposed between the first portion inner surface B12 and the first side surface 113. As shown in FIG. 7, the second flexible substrate 22 includes the third connection portion G (or the second connection portion E), similar to the first connection portion B, the third connection portion G (or the second connection portion E) also has an arc-shape structure. Similar to the first connection portion B of FIG. 7, the third connection portion G (or the second connection portion E) has a second portion outer surface G11 away from the second side surface 213, and a second portion inner surface G12 adjacent to the second side surface 213. The second portion inner surface G12 has a second curvature radius R2 and a second arc opening angle β, and a sixth thickness T6 is a thickness between the third connection portion G and the second portion outer surface G11 in the first direction. The sixth thickness T6 may be defined by a maximum thickness of the third connection portion G in the first direction X. The second curvature radius R2 and the second arc opening angle β are defined in a manner as same as the first curvature radius R1 and the first arc opening angle α. In the above embodiment, the first spacing DS1 satisfies the following formula: DS1=R1(1−cos(α/2))+T5+R2(1−cos((β/2))+T6.

Figure 8:
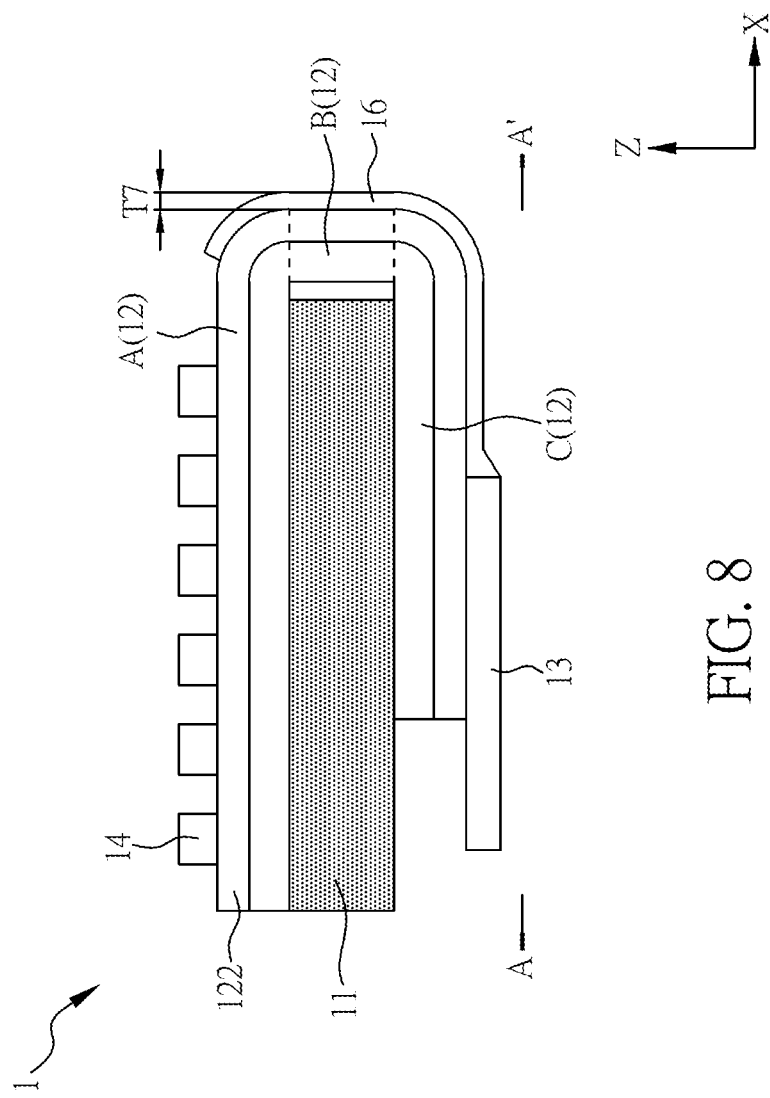
FIG. 8 is a cross-sectional view of part of the tiled electronic device according to an embodiment of the present disclosure.

FIG. 8 is a cross-sectional view of part of the tiled electronic device according to an embodiment. The tiled electronic device of FIG. 8 is similar to those of FIG. 1 to FIG. 7 except that the first electronic device 1 further includes a protection layer 16. The protection layer 16 may be disposed on the first connection portion B to increase the protection effect of the electronic device or reduce the risk of broken. In some embodiments, the protective layer 16 may be disposed on the first connection portion B and part of the first lower portion C, but it is not limited thereto. The material of the protection layer 16 is not limited, and the materials of the protection layer 16 may include glue, polymer or other suitable materials. In some embodiments, the protection layer 16 may have a high insulating property, which does not cause a short circuit between the first electronic device 1 and the second electronic device 2. In some embodiments, the protection layer 16 may contact with (or cover) part of the integrated circuit 13. With the aforementioned design, it is able to increase the protection effect of the connection portion disposed between the integrated circuit 13 and the driving circuit layer 122. In addition, the tiled electronic devices as shown in FIG. 1 to FIG. 7 may include the protection layer 16 to reduce damage of the driving circuit layer disposed on the first connection portion B, other first flexible substrate 12 or the second flexible substrate 22, or reduce influence to the normal operation of the electronic device (eg, influence to display, sensing, or detection quality).

It is noted that, the protection layer 16 has a seventh thickness T7 in the first direction X, and the seventh thickness T7 may be defined by the maximum thickness of the protection layer 16 in the first direction X. In some embodiments, the first electronic device 1 may include the protection layer 16, the seventh thickness T7 of the protection layer 16 may be added to the aforementioned formula related to the substrate spacing DS1, which is not described in detail herein. In some embodiments, other elements may be disposed between the first side surface 113 and the second side surface 213, the thickness of other components may be added to the formula related to the substrate spacing DS1. It is noted that, no matter how many components may be disposed between the first side surface 113 and the second side surface 213, the substrate spacing DS1 should be less than or equal to the first distance D1, or the ratio of the first distance D1 to the second distance D2 should be between 0.9 and 1.1 (0.9≤D1/D2≤1.1), or the ratio of the first unit pitch P' to the unit pitch P should be between 0.9 and 1.1 (0.9≤P'/P≤1.1), and the effect of seam can be reduced.

Figure 9:
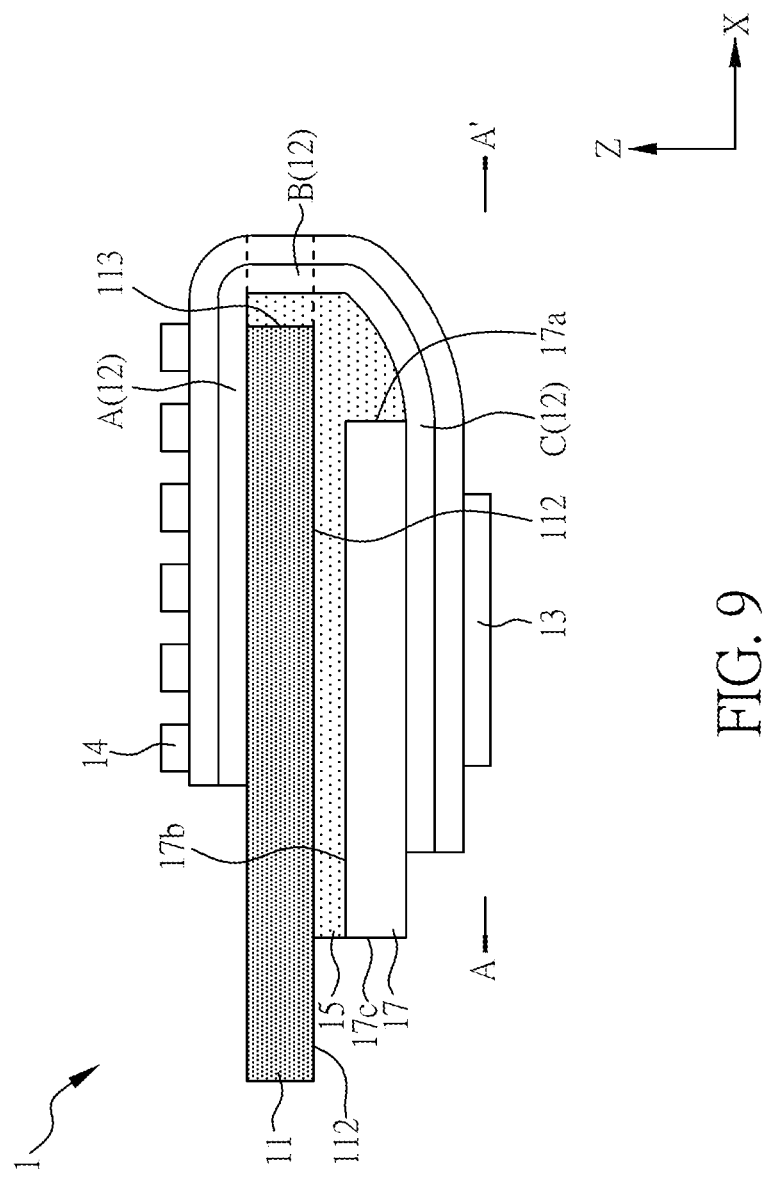
FIG. 9 is a cross-sectional view of part of the tiled electronic device according to an embodiment of the present disclosure.

FIG. 9 is a cross-sectional view of part of the tiled electronic device according to an embodiment. The tiled electronic device of FIG. 9 is similar that of FIG. 1 except that the first electronic device 1 includes a third substrate 17 disposed corresponding to the first lower surface 112, and the first adhesive member 15 is disposed between the first lower surface 112 and the third substrate 17. In some embodiments, an area of the third substrate 17 is less than an area of the first substrate 11. For example, in a top view direction of the first electronic device 1 (ie, a normal direction of the first upper surface 111 or the second direction Z), at least part of the first substrate 11 may overlap with the third substrate 17, or at least part of the first substrate 11 may cover the third substrate 17. In some embodiments, the area of the third substrate 17 projected onto the first lower surface 112 may be less than or equal to the area of the first lower surface 112, but it is not limited thereto. In some embodiments, the third substrate 17 is designed to be less than the first substrate 11, it is able to reduce the situation in the third substrate 17 protruded from the first substrate 11 in the second direction Z to increase the border. The first lower portion C may be disposed corresponding to the third substrate 17, and the first lower portion C is disposed between the integrated circuit 13 and the third substrate 17, but it is not limited thereto. In some embodiments, the third substrate 17 and the first substrate 11 may include the same substrate material. In some embodiments, the third substrate 17 and the first substrate 11 may include different substrate materials. In some embodiments, the third substrate 17 may include a substrate material with a better heat resistance (for example, a relatively small expansion change in high temperature) or moisture resistance. In some embodiments, the third substrate 17 and the first substrate 11 may have different thicknesses.

In some embodiments, the first adhesive member 15 may be disposed between a side surface 17a of the third substrate 17 and the first lower surface 112, but it is not limited thereto. In some embodiments, the first adhesive member 15 may be disposed between the third substrate 17 and the first lower surface 112. In some embodiments, the first adhesive member 15 may contact with the other side surface 17c opposite to the side surface 17a of the third substrate 17. In some embodiments, the first adhesive member 15 may contact with the side surface 17a of the third substrate 17, a side upper surface 17b of the third substrate 17, the first lower surface 112, or the first flexible circuit board 12, but it is not limited thereto. With the arrangement of the third substrate 17, an adhesion area of the first adhesive member 15 can be increased, or the mechanical characteristic of the first electronic device 1 can be increased. In addition, since the adhesion capabilities of the first adhesive member 15 to the first substrate 11 and the first flexible substrate 12 may be different. In some embodiment (FIG. 9), the materials of the first substrate 11 and the third substrate 17 may be the same or similar, the area of the third substrate 17 contacted with the first adhesive member 15 is larger, and the first adhesive member 15 may be a material having a better adhesion capability with the first substrate 11 and/or the third substrate 17, but it is not limited thereto. In some embodiments, the first adhesive member 15 may be a double-sided tape, silica gel, light curing adhesive (eg, UV adhesive), epoxy adhesive, acrylic adhesive, moisture curing adhesive, and optical clear adhesive (OCA), optical clear resin (OCR), other polymers or a combination thereof, but it is not limited thereto.

Figure 10:
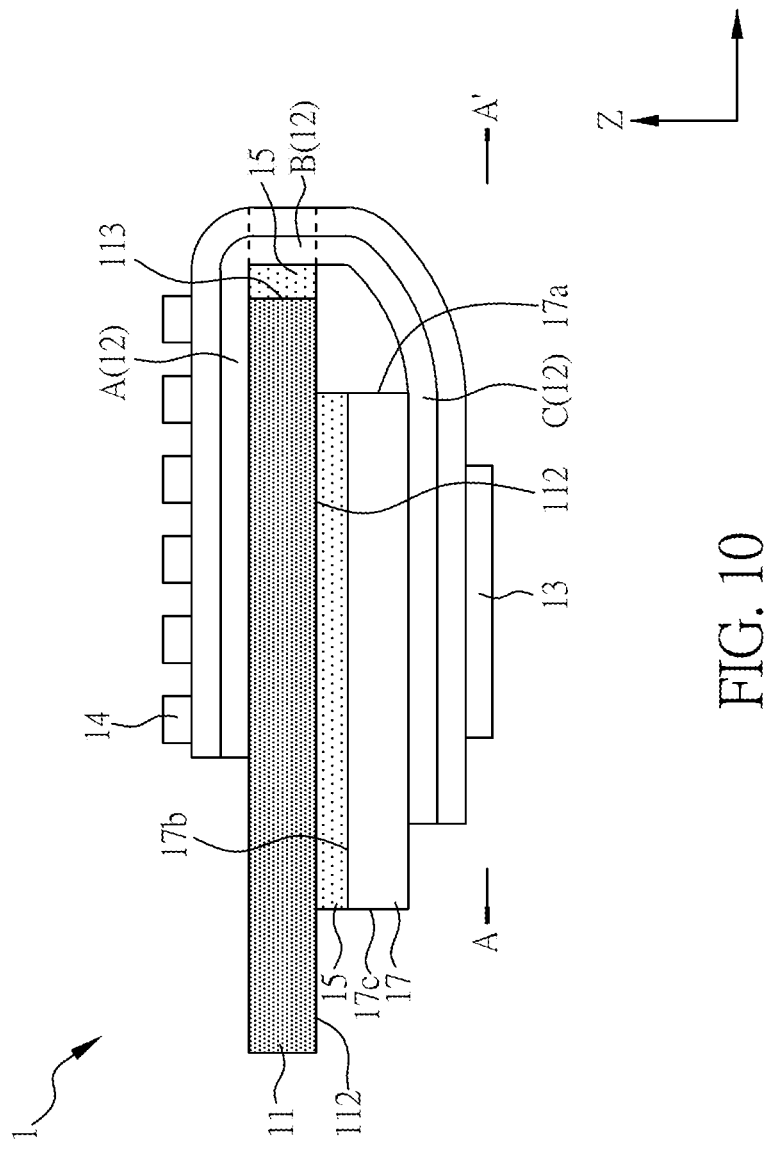
FIG. 10 is a cross-sectional view of part of the tiled electronic device according to another embodiment of the present disclosure.

FIG. 10 is a cross-sectional view of part of the tiled electronic device according to another embodiment. The tiled electronic device of FIG. 10 is similar to that of FIG. 1 except that the first adhesive member 15 of the first electronic device 1 of FIG. 10 may be discontinuous and is divided into at least two portions, one portion may be correspondingly disposed between the first side surface 113 and the first connection portion B, and the other portion may be correspondingly disposed between the first lower surface 112 and the side upper surface 17b of the third substrate 17. In some embodiments, the first adhesive member 15 may be disposed between the first side surface 113 and the first connection portion B, or the first adhesive member 15 may be disposed between the first lower surface 112 and the third substrate 17, but it is not limited thereto. The adhesive member 15 disposed between the first side surface 113 and the first connection portion B may include a light curing adhesive (including a UV light curing adhesive) or a heat curing adhesive, and the first adhesive member 15 disposed between the first lower surface 112 and the side upper surface 17b of the third substrate 17 may include a double-sided adhesive tape, a light curing adhesive (including a UV light curing adhesive) or a heat curing adhesive, but it is not limited thereto.

Figure 11:
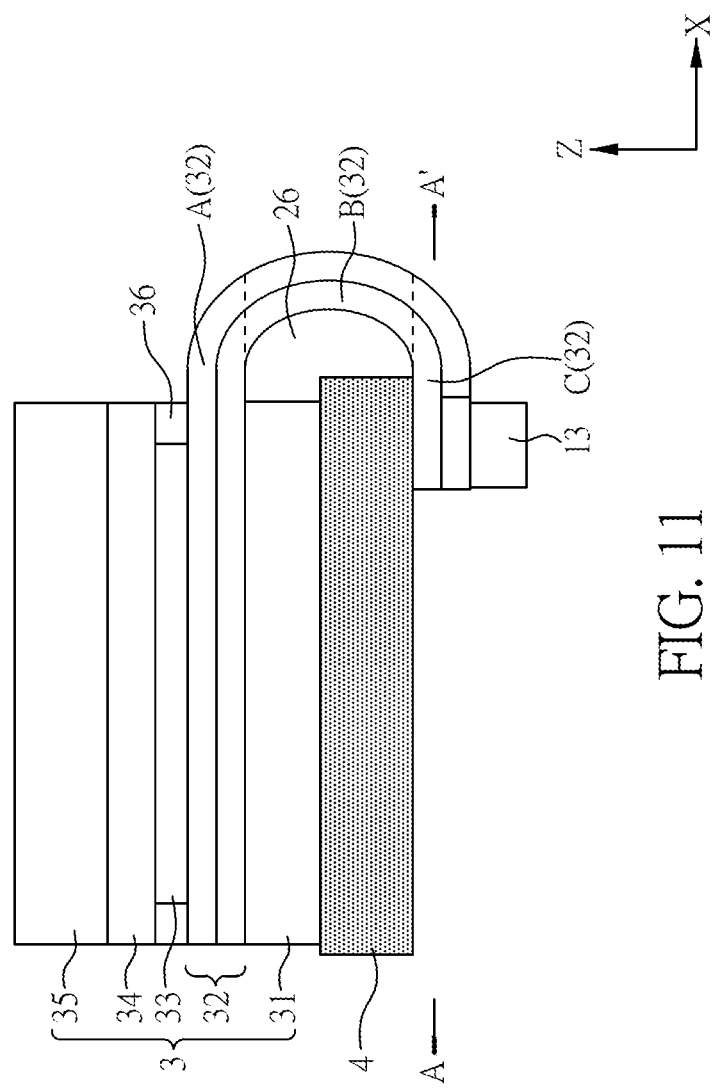
FIG. 11 is a cross-sectional view of part of the tiled electronic device according to another embodiment of the present disclosure.

FIG. 11 is a cross-sectional view of part of the tiled electronic device according to another embodiment. The tiled electronic device of FIG. 11 is similar to those of FIG. 1 to FIG. 9 except that the electronic device includes a display layer. More specifically, the tiled electronic device includes a first electronic device 3 and a backlight module 4. The backlight module 4 is disposed opposite to the first electronic device 3. The first electronic device 3 includes a first substrate 31, a first flexible substrate 32 disposed on the first substrate 31, a display layer 33 disposed on the first flexible substrate 32, a fourth substrate 34 disposed on the display layer 33, and a fifth substrates 35 disposed on the fourth substrate 34. The display layer 33 is disposed between the first flexible substrate 32 and the fourth substrate 34, and a sealant 36 is disposed between the first flexible substrate 32 and the fourth substrate 34, and the sealant 36 may surround the display layer 33. The display layer 33 may include liquid crystal (LC), organic light emitting diode (OLED), quantum dot organic light emitting diode (QOLED), quantum dot (QD), fluorescent material, phosphor material or other suitable material, but it is not limited thereto. In some embodiments, the first lower portion C may be corresponding to the backlight module 4, but it is not limited thereto. In some embodiments, the fourth substrate 34 may be a color filter substrate. In some embodiment, the fourth substrate 34 may include a color filter layer, a light shielding layer, but it is not limited thereto. In some embodiments, the fifth substrate 35 may be a protection substrate, but it is not limited thereto. The aforementioned backlight module 4 may include a backlight source, an optical film, a backlight frame, but it is not limited thereto. In some embodiments, the backlight module 4 may be a direct-type backlight module or an edge-type backlight module, but it is not limited thereto.

Figure 12:
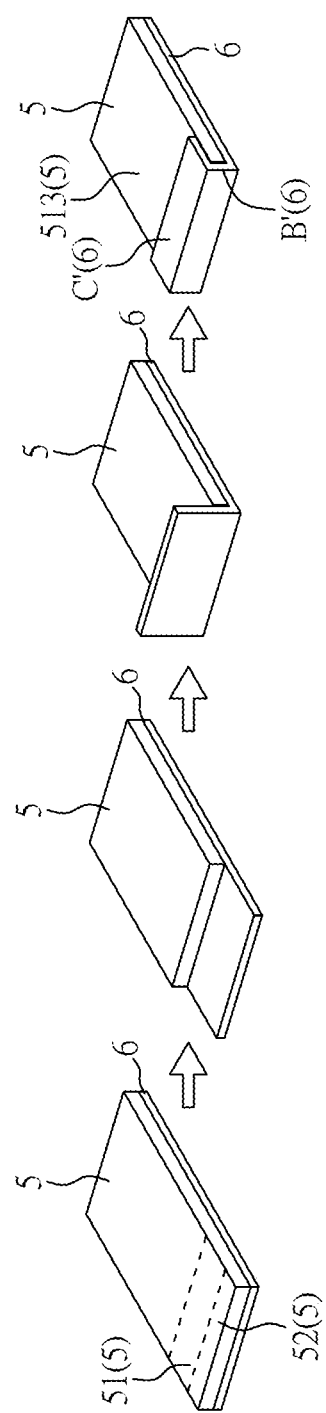
FIG. 12 is a schematic diagram of a manufacturing process according to an embodiment of the present disclosure.

FIG. 12 is a schematic diagram of a manufacturing process according to an embodiment of the present disclosure. First, a substrate 5 and a flexible substrate 6 are provided, wherein the substrate 5 and the flexible substrate 6 may be adhered to each other. In some embodiments, the flexible substrate 6 may be coated on the substrate 5, but it is not limited thereto. Then, the flexible substrate 6 is disposed with circuit and/or electronic element switches (not shown) through the manufacturing process of film formation, photolithography, development and/or etching. Then, in some embodiments (FIG. 12), part of the substrate 5 may be removed by laser cutting or the like. For example, it may remove a substrate block 51 of the substrate 5 corresponding to a flexible substrate connection portion B' and a substrate block 52 of the substrate 5 corresponding to a flexible substrate lower portion C'. Then, an adhesive member (not shown in FIG. 12, while the aforementioned first adhesive member 15 may be referenced) may be coated or disposed on at least one of the flexible substrate connection portion B' and the flexible substrate lower portion C'. The adhesive member 15 may be disposed on a lower surface 513 of part of the substrate 5. Subsequently, the adhesive member is cured after bending the flexible substrate connection portion B', the flexible substrate lower portion C' is opposite to the lower surface 513. In this case, the adhesive member may be a glue material cured by UV light curing, heat curing, moisture curing or other curing method, but it is not limited thereto. The manufacturing process may further include a step of disposing a protection layer (not shown in FIG. 12, but the protection layer 16 of FIG. 8 may be referenced) on an outer side wall of the flexible substrate connection portion B' away from the substrate 5, and the protection layer may be disposed on part of the lower surface 513, but it is not limited thereto. The step of disposing a protection layer is not particularly limited, which may be performed before bending the flexible substrate connection portion B' or after bending the flexible substrate connection portion B'. The protection layer may be formed by coating a protection adhesive and curing the protection adhesive, but it is not limited thereto. The manufacturing process may include a step of disposing the electronic unit on a surface opposite to the lower surface 513 of the substrate 5 (not shown in FIG. 12, the aforementioned first upper surface 111 may be referenced), and this step may be performed after using a laser cutting or other cutting method to remove part of the substrate 5, or this step may be performed after curing the adhesive member, but it is not limited thereto.

Figure 13:
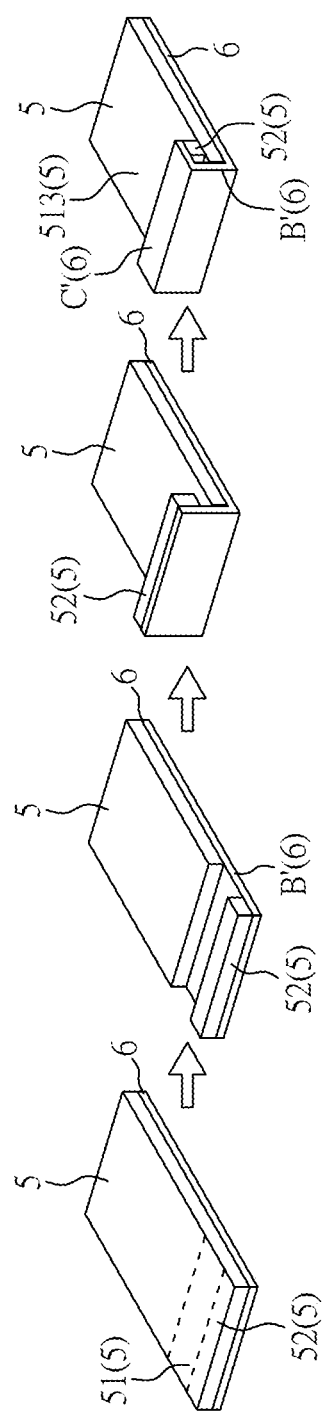
FIG. 13 is a schematic diagram of a manufacturing process according to another embodiment of the present disclosure.

FIG. 13 is a schematic diagram of a manufacturing process according to another embodiment. The manufacturing process of FIG. 13 is similar to that of FIG. 12 except that the removed part of the substrate 5 is different. For example, in the embodiment (FIG. 13), it removes the substrate block 51 of the substrate 5 corresponding to the flexible substrate connection portion B', the substrate block 52 of the substrate 5 corresponding to the flexible substrate lower portion C' is retained, but it is not limited thereto. The subsequent coating or disposing of an adhesive member is similar to FIG. 12, and thus a detailed description is deemed unnecessary. After manufacturing an electronic device by using the manufacturing process of FIG. 13, the electronic device may be similar to the first electronic device of FIG. 9 or FIG. 10.

Figure 14A:
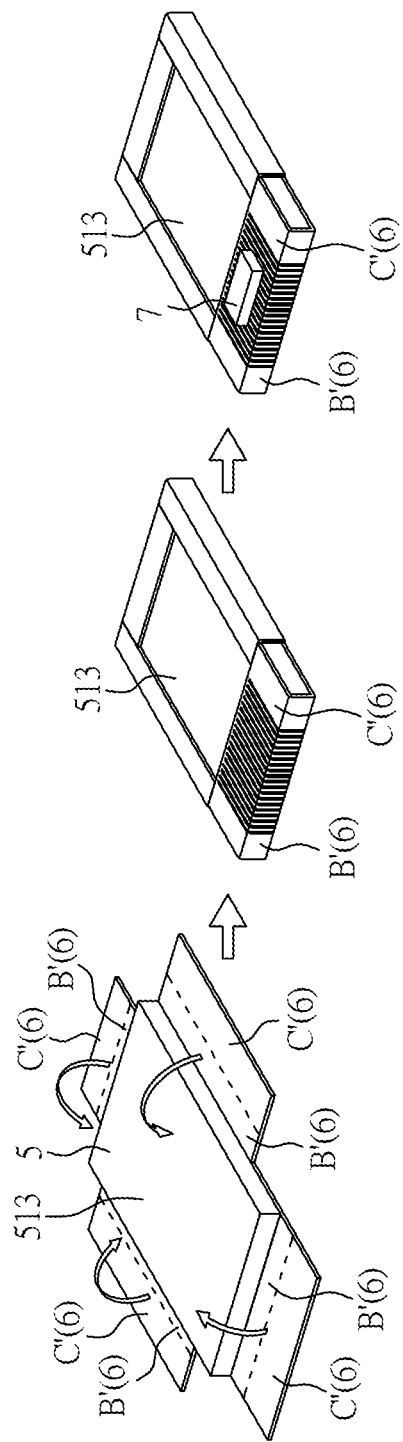
FIGS. 14A and 14B are schematic diagrams of part of the tiled electronic device according to an embodiment of the present disclosure.
Figure 14B:
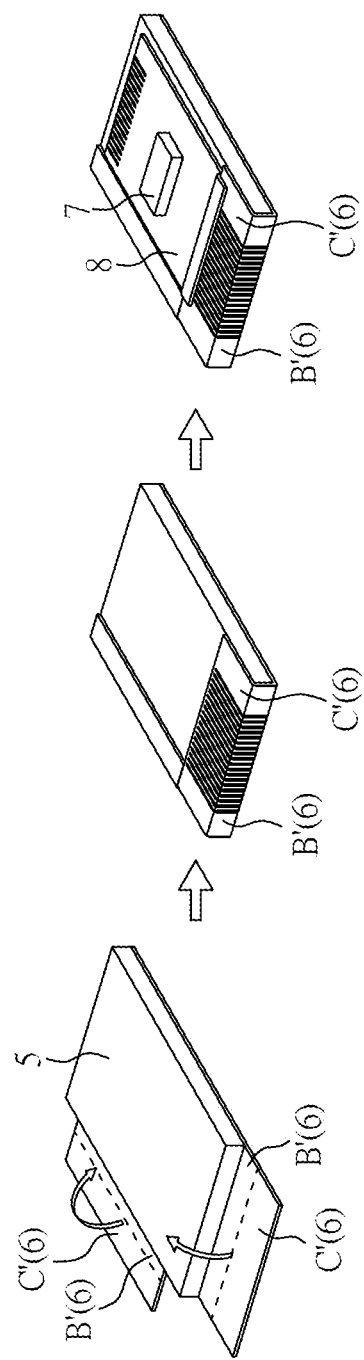

In the examples of FIG. 12 and FIG. 13, the tiled electronic device may include one flexible substrate connection portion B''. In other embodiments, the tiled electronic device may include more flexible substrate connection portions B', it is possible to remove other corresponding substrate portions. FIGS. 14A and 14B are schematic diagrams of part of the tiled electronic device according to an embodiment of the present disclosure. The flexible substrate 6 may include at least one flexible substrate connection portion B'. The at least one flexible substrate connection portion B' is connected to the flexible substrate lower portion C'. The driving circuit layer disposed on the at least one flexible substrate lower portion C' may be coupled with an integrated circuit 7. In some embodiment (FIG. 14A), the flexible substrate 6 may have four flexible substrate connection portions B' and four flexible substrate lower portions C' respectively connected to the flexible substrate connection portions B', but it is not limited thereto. A tiled electronic device with the four flexible substrate connection portions B' disposed respectively corresponding to the four sides of the substrate 5, it is able to reduce the four sides of the substrate 5 from collision in the process of tiling or transportation, or to reduce the risk of broken. In some embodiments, a plurality of flexible substrate lower portions C' are, staggered with each other, which do not overlap with (or contact with) each other (as shown in FIG. 14A), so as to reduce the overlapping of the flexible substrate lower portions C' that may result in the tiled electronic device having a difference heights, or to reduce the driving circuit layer (referring to the aforementioned driving circuit layer 122) disposed on the flexible substrate connection portions B' (and/or the flexible substrate lower portions C') being covered with other flexible substrate lower portions C', which may affect the arrangement or coupling of the integrated circuit 7. In some embodiments, the flexible substrate lower portion C' may have various shapes, the contour of the flexible substrate lower portion C' projected onto the substrate lower surface 513 may include a rectangle or a non-rectangle, and the non-rectangle may be a trapezoid, a triangle, a polygon or an arc shape, but it is not limited thereto. In some embodiments, the flexible substrate connection portion B' may be partially corresponding to (or partially cover) the side of the corresponding substrate 5.

In addition, in some embodiment (FIG. 14B), the flexible substrate 6 may have two flexible substrate connection portions B' and two flexible substrate lower portions C' respectively connected to the flexible substrate connection portions B', and two flexible substrate connection portions B' may be disposed adjacent to each other. In other words, two flexible substrate connection portions B' may be disposed respectively corresponding to two adjacent sides of the substrate 5, and the two adjacent sides of the substrate 5 are two sides connected to each other, but it is not limited thereto. As disclosed in the previous embodiment, the two flexible substrate connection portions B' may be disposed corresponding to two opposite sides of the substrate 5. Alternatively, the flexible substrate connection portions B' may be disposed only corresponding to one side of the substrate 5.

As shown in FIG. 14A, the integrated circuit 7 may be disposed on the flexible substrate lower portion C' connected to at least one flexible substrate connection portions B', and the flexible substrate lower portions C' and the flexible substrate connection portions B' connected with the flexible substrate lower portions C' may be disposed a driving circuit layer (referring to the aforementioned driving circuit layer 122) according to the requirement. Through the driving circuit layer, the electronic unit (referring to the aforementioned first electronic unit 14) is coupled to the integrated circuit 7, but it is not limited thereto. As shown in FIG. 14B, the integrated circuit 7 may be disposed on another circuit board 8 (which may be a flexible circuit board or a rigid circuit board, but it is not limited thereto), and then the circuit board 8 is coupled to the flexible circuit board 6. The arrows in FIGS. 14A and 14B indicate the bending direction of the flexible substrate connection portion B' and the flexible substrate lower portion C'.

In the present disclosure, the rectangle is taken as an example for the first electronic device 1 and/or the second electronic device 2. For example, the area of the first upper surface 111 and/or the area of the second upper surface 121 may be rectangular, but it is not limited thereto. The first upper surface 111 of the first electronic device 1 may be other external structure such as a polygon, a diamond, or any shape suitable for tiling. However, regardless of the shape, the substrate spacing DS1 is designed to be less than or equal to the first distance D1, and the difference between the first distance D1 and the second distance D2 is within 10%. In the figures, the angle between the first upper surface 111 and the first side surface 113, or the angle between the first lower surface 112 and the first side surface 113 is shown to be substantially a right angle, but it is not limited thereto. In some embodiments, the angle between the first upper surface 111 and the first side surface 113 or the angle between the first lower surface 112 and the first side surface 113 may be in a range from 90 to 30 degrees. In some embodiments, the angle between the first upper surface 111 and the first side surface 113, or the angle between the first lower surface 112 and the first side surface 113 may be in a range from 80 to 60 degrees. In some embodiments, a shape between the first upper surface 111 and the first side surface 113 is a curved or polygonal shape, or a sharp corner edge present between the first upper surface 111 and the first side surface 113 or between the first lower surface 112 and the first side surface 113.

In summary, the tiled electronic device is able to achieve the effect of reducing seam, lower the risk of broken, or increase the display quality by bending the flexible substrate under the substrate, designing the substrate spacing DS1 to be less than or equal to the first distance D1, enabling the ratio of the first distance D1 to the second distance D2 to be 0.9 to 1.1 ($0.9 \leq D1/D2 \leq 1.1$), or enabling the ration of the first unit pitch P' to the unit pitch P to be 0.9 to 1.1 ($0.9 \leq P'/P \leq 1.1$).

Although the present invention has been explained in relation to its preferred embodiment, it is understood that many other possible modifications and variations can be made without departing from the spirit and scope of the invention as hereinafter claimed.

What is claimed is:

1. A tiled electronic device comprising:
a first electronic device including:

a first substrate having a first upper surface, a first lower surface opposite to the first upper surface, and a first side surface connected between the first upper surface and the first lower surface;

a first flexible substrate comprising a first upper portion, a first lower portion, and a first connection portion connected between the first upper portion and the first lower portion; and a driving circuit layer disposed on the first upper portion, the first lower portion and the first connection portion, wherein the first upper portion is disposed corresponding to the first upper surface, the first lower portion is disposed corresponding to the first lower surface, and the first connection portion is disposed corresponding to the first side surface; and a second electronic device disposed adjacent to the first electronic device and comprising:

a second substrate having a second upper surface, a second lower surface opposite to the second upper surface, and a second side surface connected between the second upper surface and the second lower surface, wherein the second side surface is opposite and adjacent to the first side surface, and the first connection portion is located between the first side surface and the second side surface.

2. The tiled electronic device as claimed in claim 1, wherein the driving circuit layer comprises an active driving element.

3. The tiled electronic device as claimed in claim 1, wherein the first electronic device further comprises an integrated circuit disposed corresponding to the first lower surface and coupled to the driving circuit layer.

4. The tiled electronic device as claimed in claim 1, wherein the first electronic device further comprises a first adhesive member disposed between the first side surface and the first connection portion.

5. The tiled electronic device as claimed in claim 1, wherein the first electronic device further comprises a first adhesive member disposed between the first lower surface and the first lower portion.

6. The tiled electronic device as claimed in claim 1, wherein the first electronic device further comprises a third substrate and a first adhesive member, the third substrate is disposed corresponding to the first lower surface, and the first adhesive member is disposed between the first lower surface and the third substrate.

7. The tiled electronic device as claimed in claim 6, wherein in a normal direction of the first upper surface, an area of the third substrate is less than an area of the first substrate.

8. The tiled electronic device as claimed in claim 1, wherein the second electronic device further comprises a second flexible substrate including a second upper portion, a second lower portion and a second connection portion connected between the second upper portion and the second lower portion, the second upper portion is disposed corresponding to the second upper surface, and the second lower portion is disposed corresponding to the second lower surface.

9. The tiled electronic device as claimed in claim 8, wherein the second electronic device further comprises another driving circuit layer disposed on the second upper portion, the second lower portion and the second connection portion.

10. The tiled electronic device as claimed in claim 9, wherein the second connection portion is disposed corresponding to the second side surface, and the second connection portion is located between the second side surface and the first connection portion.

11. The tiled electronic device as claimed in claim 9, wherein the second substrate further comprises a third side surface opposite to the second side surface, the third side surface is connected between the second upper surface and the second lower surface, and the second connection portion is disposed corresponding to the third side surface.

12. The tiled electronic device as claimed in claim 11, wherein the second flexible substrate further comprises a third connection portion connected to the second upper portion, and the third connection portion is disposed corresponding to the second side surface and located between the second side surface and the first connection portion.

13. The tiled electronic device as claimed in claim 12, wherein the another driving circuit layer is not disposed on the third connection portion.

14. The tiled electronic device as claimed in claim 1, wherein the first electronic device further comprises a plurality of first electronic units disposed on the first upper surface, and the second electronic device further comprises a plurality of second electronic units disposed on the second upper surface, the plurality of first electronic units have an edge electronic unit adjacent to the second electronic device, a first distance is between the-edge electronic unit and one of the second electronic units closest to the-edge electronic unit, a substrate spacing is between the first side surface and the second side surface, and the substrate spacing is less than or equal to the first distance.

15. The tiled electronic device as claimed in claim 14, wherein a second distance is between two adjacent ones of the plurality of first electronic units, and a ratio of the first distance to the second distance is between 0.9 and 1.1.

16. The tiled electronic device as claimed in claim 1, wherein the first electronic device further comprises a protection layer disposed on the first connection portion.

17. The tiled electronic device as claimed in claim 1, wherein the first electronic device or the second electronic device is a display device.

18. The tiled electronic device as claimed in claim 1, wherein the first electronic device or the second electronic device is an antenna device, or a detection device.

19. The tiled electronic device as claimed in claim 1, wherein the first electronic device or the second electronic device is a backlight device.

* * * * *